United States Patent
Hashimoto et al.

(10) Patent No.: US 9,106,301 B2
(45) Date of Patent: Aug. 11, 2015

(54) RELAY NODE SIMULATOR AND TEST METHOD

(71) Applicant: Anritsu Corporation, Kanagawa (JP)

(72) Inventors: Reiichi Hashimoto, Kanagawa (JP); Syun Hosokawa, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 437 days.

(21) Appl. No.: 13/632,401

(22) Filed: Oct. 1, 2012

(65) Prior Publication Data

US 2013/0085737 A1 Apr. 4, 2013

(30) Foreign Application Priority Data

Oct. 4, 2011 (JP) ................... 2011-219712

(51) Int. Cl.
- *G06G 7/62* (2006.01)
- *H04B 7/155* (2006.01)
- *G06F 17/50* (2006.01)
- *H04B 17/40* (2015.01)
- *H04B 17/391* (2015.01)

(52) U.S. Cl.
CPC .............. *H04B 7/155* (2013.01); *G06F 17/509* (2013.01); *H04B 17/40* (2015.01); *H04B 17/3911* (2015.01); *H04B 17/3912* (2015.01)

(58) Field of Classification Search
CPC ...... H04W 84/047; H04W 88/04; H04B 7/14; H04B 7/2206; H04B 7/165; H04B 7/17; H04L 41/22; G06F 11/261; G06F 11/263; G06F 17/509
See application file for complete search history.

(56) References Cited

U.S. PATENT DOCUMENTS

| | | | | |
|---|---|---|---|---|
| 6,724,730 | B1* | 4/2004 | Mlinarsky et al. | 370/241 |
| 6,993,069 | B1* | 1/2006 | Donati et al. | 375/224 |
| 8,417,501 | B2* | 4/2013 | Spilman | 703/13 |
| 8,718,122 | B2* | 5/2014 | Griesing et al. | 375/224 |
| 8,781,797 | B1* | 7/2014 | Oltman et al. | 703/2 |
| 2011/0124295 | A1* | 5/2011 | Mahjoubi Amine et al. | 455/67.14 |

(Continued)

FOREIGN PATENT DOCUMENTS

JP 2011-82678 A 4/2011
WO 2011-043325 A1 4/2011

OTHER PUBLICATIONS

Quaium, Adnan, "Evaluation of Relay-Enhanced LTE-Advanced Netowrks", MSc Thesis, Delft University of Technology, Apr. 2011.*

(Continued)

Primary Examiner — Mary C Jacob
(74) Attorney, Agent, or Firm — Pearne & Gordon LLP

(57) ABSTRACT

A relay node simulator includes a marker display control unit that correlates a base station marker, a relay node marker, and a terminal marker to a predetermined coordinate system and allows the makers to be displayed on an operation screen, and that allows at least one of the markers to be displayed on the operation screen in a movable manner in accordance with an operation input, a position specifying unit that specifies respective positions of the respective markers in the coordinate system, and a pattern display control unit that allows a magnitude of a characteristic value relating to a first RF signal or a second RF signal to be displayed on the operation screen as a discriminable pattern, wherein, a test signal to which the characteristic value corresponding to the specified position is applied is output.

12 Claims, 11 Drawing Sheets

(56) References Cited

U.S. PATENT DOCUMENTS

2011/0159805 A1* 6/2011 Hart .................................. 455/9
2011/0257923 A1* 10/2011 Boulton ........................ 702/117
2011/0306306 A1* 12/2011 Reed .......................... 455/67.11
2012/0263098 A1 10/2012 Takahashi et al.

OTHER PUBLICATIONS

Liebl et al, "Experimental Testbed for 3GPP System Architecture Evolution", Simulation Works, Mar. 15-19, 2010.*
Agilent Technologies, "Introducing LTE-Advanced", Application Note, Mar. 8, 2011.*
Andreozzi et al, "LTE and LTE-Advanced Evaluation Through Innovative Simulation Tool", IEEE International Symposium on a World of Wireless, Mobile and Multimedia Networks, Jun. 20-24, 2011.*
Agilent Technologies, "Agilent 3GPP Long Term Evolution: System Overview, Product Development and Test Challenges", Application Note, Sep. 8, 2009.*
Liu et al, "Recent Results on Relaying for LTE-Advanced", IEEE 2009.*
Shiobing, Anto, "Performance of Repeaters in 3GPP LTE", Master of Science Thesis, Thesis, KTH School of Information and Communications Technology (ICT) Radio Communications, Jun. 2009.*

* cited by examiner

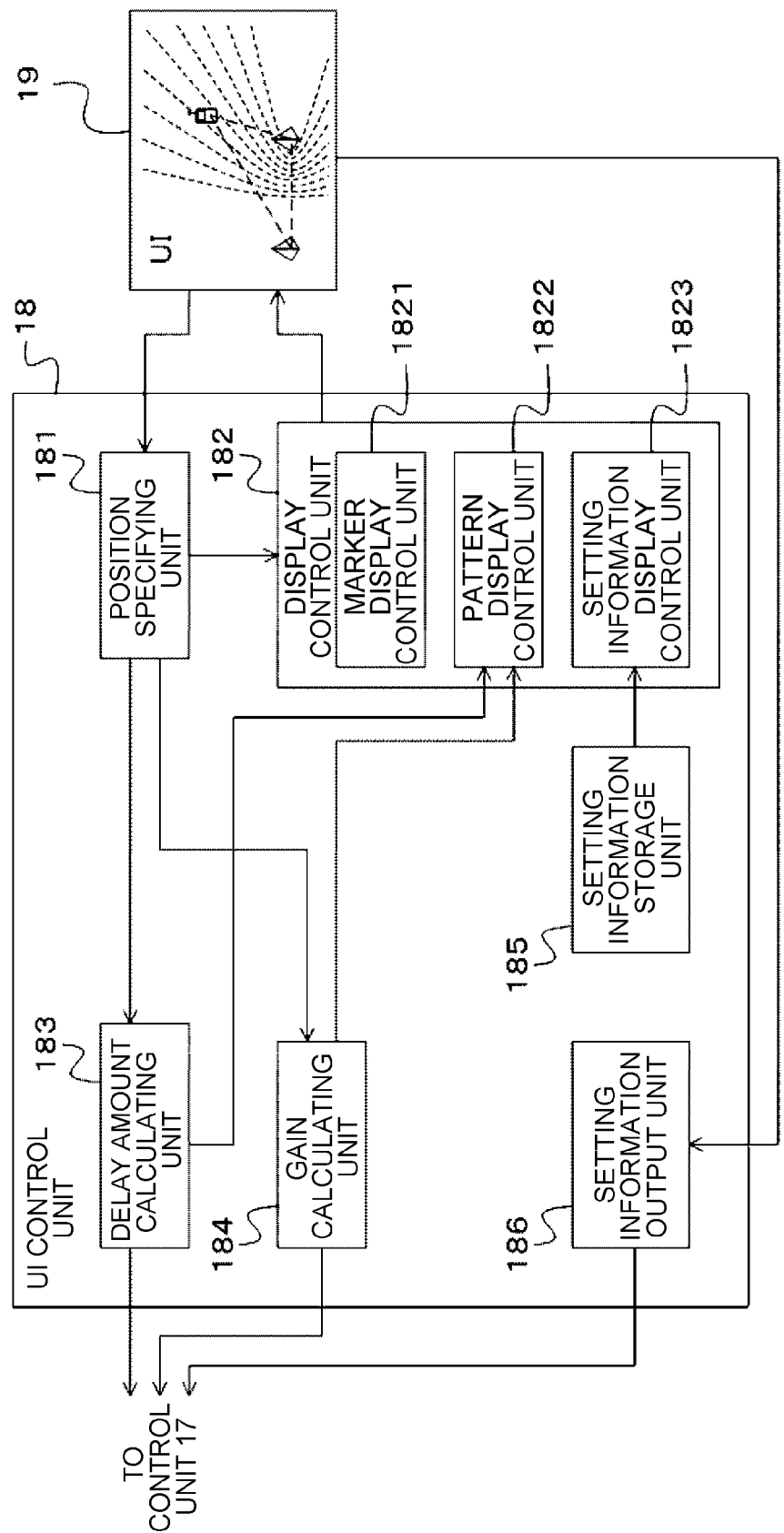

US 9,106,301 B2

RELAY NODE SIMULATOR AND TEST METHOD

BACKGROUND OF THE INVENTION

1. Technical Field

The present invention relates to a technology of a relay node simulator that simulates a relay node that relays communication between a base station and a mobile communication terminal.

2. Background Art

Standardization of LTE-Advanced, which is further developed from LTE (Long Term Evolution), as a wireless access scheme of next-generation mobile communication system has been in progress using the Third Generation Partnership Project (3GPP). In LTE-Advanced, a relay technology, which performs regenerative relaying of a radio signal between a base station and a mobile communication terminal at a layer 3 level, has been reviewed. When applying a relay node in which this relay technology is used, expansion of efficient coverage has been expected at locations at which it is difficult to secure a wired backhaul line that connects devices such as a switching center and a wireless base station that make up a mobile communication system with a wire, or the like (Patent Document 1).

In such a relay node, there are cases where a wireless backhaul line between the base station and the relay node, and a wireless access line between the relay node and the mobile communication terminal are operated at the same frequency. In this regard, in a case where sufficient isolation is not secured between these lines, a transmitted signal is wrapped around to a reception unit of the relay node and causes interference. Therefore, in a case of operation in the same frequency, radio resources of the wireless backhaul line and the wireless access line are subjected to TDM (Time Division Multiplexing) and transmission and reception at the relay node are controlled not to be carried out simultaneously. In addition, in addition to the above-described configuration, a configuration in which signals are continuously output from the base station, and allocation of resource elements is controlled with respect to signals from the base station and signals from the relay node to prevent interference of these signals has been reviewed. However, the present invention is also applicable to this configuration. Hereinafter, the above-described time division multiplexing configuration will be described as an example.

However, the level of each signal may vary or several signals may be delayed depending on a positional relationship between the base station, the relay node, and the mobile communication terminal. For example, until reception by the mobile communication terminal, the level of a signal transmitted from the base station is attenuated in accordance with the distance between the base station and the mobile communication terminal. Similarly, until being received by the mobile communication terminal, a level of a signal transmitted from the relay node is attenuated in accordance with the distance between the relay node and the mobile communication terminal. In addition, in a case where several signals are delayed, interference may occur between these signals. Therefore, it is necessary to verify an operation of the mobile communication terminal that is a terminal to be tested on the assumption that a variation in a level of these signals or delaying occurs, and a simulator that simulates this environment has been required.

RELATED ART DOCUMENT

Patent Document

[Patent Document 1] Japanese Unexamined Patent Application Publication No. 2011-82678

BRIEF SUMMARY OF THE INVENTION

An object of the present invention is to provide a relay node simulator, which displays a positional relationship between a base station, a relay node, and a terminal to be tested, and an amount of delay or an amount of attenuation that corresponds to the positional relationship on a display screen in a confirmable manner, and which is capable of easily setting the amount.

Means for Solving the Problems

To accomplish the object, according an invention described in claim 1, there is provided a relay node simulator (1) that outputs a test signal obtained by simulating a signal in which a first RF signal transmitted from a base station and a second RF signal that is transmitted to a mobile communication terminal by a relay node that receives the first RF signal are multiplexed. The relay node simulator includes: a user interface unit (19) that displays an operation screen and receives an operation input from an operator; a marker display control unit (1821) that correlates a base station marker ($V_{eNB}$) corresponding to the base station, a relay node marker ($V_{RN}$) corresponding to the relay node, and a terminal marker ($V_{UE}$) corresponding to the mobile communication terminal to a predetermined coordinate system and allows the markers to be displayed on the operation screen, and that allows at least one of the markers to be displayed on the operation screen in a movable manner in accordance with the operation input; a position specifying unit (181) that specifies respective positions of the base station marker, the relay node marker, and the terminal marker in the coordinate system; and a pattern display control unit (1822) that allows the magnitude of a characteristic value relating to the first RF signal or the second RF signal to be displayed on the operation screen as a discriminable pattern (G11, G21, G22, or G31). When a position of at least one of the respective markers is specified in the pattern, the test signal to which the characteristic value corresponding to the specified position is applied is output.

In addition, according to an invention described in claim 2 according to claim 1, the relay node simulator may further include a delay amount calculating unit (183) that calculates an amount of delay of the second RF signal until the second RF signal reaches the mobile communication terminal using the position of the terminal marker with respect to the position of the base station marker and the position of the relay node marker that are specified as variables. On the basis of the amount of delay calculated as the characteristic value, the pattern display control unit may allow a magnitude of the amount of delay corresponding to the position of the terminal marker to be displayed on the operation screen as the discriminable pattern (G11), and when the position of the terminal marker is designated on the pattern, the test signal, which is obtained by simulating a signal in which the first RF signal and the second RF signal to which the amount of delay corresponding to the designation position is applied are multiplexed, may be output.

In addition, according to an invention described in claim 3 according to claim 2, the delay amount calculating unit may calculate the amount of delay on the basis of the distance between the base station marker and the relay node marker in the coordinate system.

In addition, according to an invention described in claim 4 according to claim 2, the pattern display control unit may allow a curved line, which is obtained by connecting the positions in which the amounts of delay that are calculated are substantially the same, to be displayed on the operation screen as the pattern for each amount of delay.

In addition, according to an invention described in claim 5 according to claim 1, the relay node simulator may further include a gain calculating unit (184) that calculates an amount of attenuation corresponding to the distance from a corresponding marker in the coordinate system with respect to signals that are transmitted from respective devices such as the base station and the relay node. On the basis of the amount of attenuation that is calculated as the characteristic value, the pattern display control unit may allow a magnitude of the amount of attenuation of each of the signals which are transmitted from the respective devices, at each position of the coordinate system to be displayed on the operation screen as the discriminable patterns (G21 and G22). When the respective positions of the base station marker, the relay node marker, and the terminal marker are specified in the pattern, the test signal, which is obtained by simulating a signal in which the first RF signal which is transmitted from the base station and to which the amount of attenuation corresponding to the specified position is applied and the second RF signal which is transmitted from the relay node and to which the amount of attenuation corresponding to the specified position is applied are multiplexed, may be output.

In addition, according to an invention described in claim 6 according to claim 1, the relay node simulator may further include a gain calculating unit (184) that calculates an amount of attenuation corresponding to the distance from the terminal marker in the coordinate system with respect to signals that are received by the mobile communication terminal. On the basis of the amount of attenuation that is calculated as the characteristic value, the pattern display control unit may allow a magnitude of the amount of attenuation at each position of the coordinate system to be displayed on the operation screen as the discriminable pattern (G31). When the respective positions of the base station marker, the relay node marker, and the terminal marker are specified in the pattern, the test signal, which is obtained by simulating a signal in which the first RF signal which is transmitted from the base station and to which the amount of attenuation corresponding to the specified position is applied and the second RF signal which is transmitted from the relay node and to which the amount of attenuation corresponding to the specified position is applied are multiplexed, may be output.

In addition, according to an invention described in claim 7, there is provided a test method that outputs a test signal obtained by simulating a signal in which a first RF signal transmitted from a base station and a second RF signal that is transmitted to a mobile communication terminal by a relay node that receives the first RF signal are multiplexed. The test method includes: a screen display step of correlating a base station marker ($V_{eNB}$) corresponding to the base station, a relay node marker ($V_{RN}$) corresponding to the relay node, and a terminal marker ($V_{UE}$) corresponding to the mobile communication terminal to a predetermined coordinate system and allowing the markers to be displayed on an operation screen in a relatively movable manner; a position specifying step of specifying respective positions of the base station marker, the relay node marker, and the terminal marker in the coordinate system; a pattern display step of allowing a magnitude of a characteristic value relating to the first RF signal or the second RF signal to be displayed on the operation screen as a discriminable pattern (G11, G21, G22, or G31); and an output step of outputting the test signal to which the characteristic value corresponding to the specified position is applied when a position of at least one of the respective markers is specified in the pattern.

In addition, according to an invention described in claim 8 according to claim 7, the test method may further include a delay amount calculating step of calculating an amount of delay of the second RF signal until the second RF signal reaches the mobile communication terminal by using the position of the terminal marker with respect to the position of the base station marker and the position of the relay node marker that are specified as a variable. In the pattern display step, on the basis of the amount of delay calculated as the characteristic value, a magnitude of the amount of delay corresponding to the position of the terminal marker may be allowed to be displayed on the operation screen as the discriminable pattern (G11). In the output step, when the position of the terminal marker is designated on the pattern, the test signal, which is obtained by simulating a signal in which the first RF signal and the second RF signal to which the amount of delay corresponding to the designation position is applied are multiplexed, may be output.

In addition, according to an invention described in claim 9 according to claim 8, in the delay amount calculating step, the amount of delay may be calculated on the basis of the distance between the base station marker and the relay node marker in the coordinate system.

In addition, according to an invention described in claim 10 according to claim 8, in the pattern display step, a curved line, which is obtained by connecting the positions in which the amounts of delay that are calculated are substantially the same, may be allowed to be displayed on the operation screen as the pattern for each amount of delay.

In addition, according to an invention described in claim 11 according to claim 7, the test method may further include a gain calculating step of calculating an amount of attenuation corresponding to the distance from a corresponding marker in the coordinate system with respect to signals that are transmitted from respective devices such as the base station and the relay node. In the pattern display step, on the basis of the amount of attenuation that is calculated as the characteristic value, magnitudes of the amount of attenuation of signals, which are transmitted from the respective devices, at each position of the coordinate system may be allowed to be displayed on the operation screen as the discriminable patterns (G21 and G22). In the output step, when the respective positions of the base station marker, the relay node marker, and the terminal marker are specified in the pattern, the test signal, which is obtained by simulating a signal in which the first RF signal which is transmitted from the base station and to which the amount of attenuation corresponding to the specified position is applied and the second RF signal which is transmitted from the relay node and to which the amount of attenuation corresponding to the specified position is applied are multiplexed, may be output.

In addition, according to an invention described in claim 12 according to claim 7, the test method may further include a gain calculating step of calculating an amount of attenuation corresponding to the distance from the terminal marker in the coordinate system with respect to signals that are received by the mobile communication terminal. In the pattern display step, on the basis of the amount of attenuation that is calculated as the characteristic value, a magnitude of the amount of attenuation at each position of the coordinate system may be allowed to be displayed on the operation screen as the discriminable pattern (G31). In the output step, when the respective positions of the base station marker, the relay node marker, and the terminal marker are specified in the pattern, the test signal, which is obtained by simulating a signal in which the first RF signal which is transmitted from the base station and to which the amount of attenuation corresponding to the specified position is applied and the second RF signal which is transmitted from the relay node and to which the amount of attenuation corresponding to the specified position is applied are multiplexed, may be output.

Advantage of the Invention

In the relay node simulator and the test method according to the present invention, in the case of changing a position of the terminal marker, an amount of delay of a second RF signal with respect to a first RF signal until reaching the mobile communication terminal is calculated on the basis of positions of the base station marker and the relay node marker, and a magnitude of this amount of delay is displayed on an operation screen in a discriminable manner. In addition, a test signal, which corresponds to the amount of delay corresponding to the position of the terminal marker that is designated on the operation screen, is generated and is transmitted. Due to this, by merely determining a positional relationship between the base station marker, the relay node marker, and the terminal marker, it is possible to set an amount of delay for generating a test signal corresponding to the positional relationship, and thus this amount of delay may be easily set.

In addition, in the relay node simulator and the test method according to the present invention, an amount of attenuation corresponding to the distance from a terminal marker that is designated on the operation screen in a coordinate system is calculated, and a magnitude of this amount of attenuation is displayed on the operation screen in a discriminable manner. In addition, a test signal, which corresponds to the amount of attenuation corresponding to respective positions of the base station marker, the relay node marker, and the terminal marker that are specified in the operation screen, is generated and is transmitted. Due to this, by merely determining a positional relationship between the base station marker, the relay node marker, and the terminal marker, it is possible to set an amount of attenuation for generating a test signal corresponding to the positional relationship, and thus this amount of attenuation may be easily set.

BRIEF DESCRIPTION OF THE DRAWINGS

FIG. 2B is a block diagram illustrating a detailed configuration of an UI control unit.

DETAILED DESCRIPTION OF THE INVENTION

Figure 1:
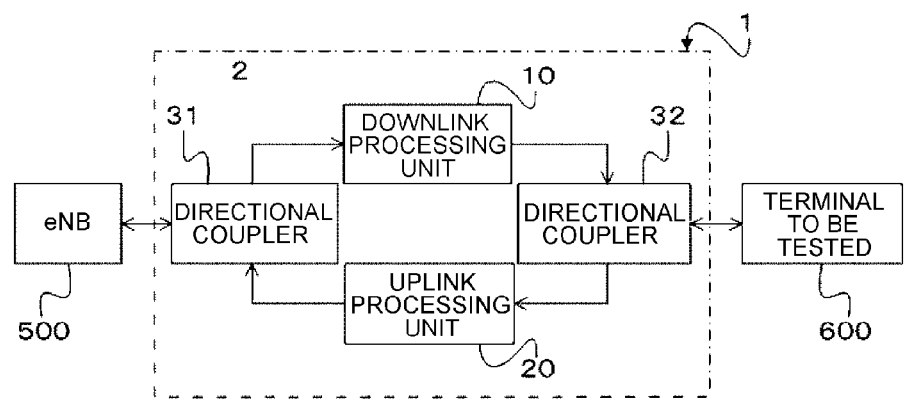
FIG. 1 is a block diagram illustrating a schematic configuration of a relay node simulator according to the present invention.

A relay node simulator 1 relating to the present invention is a simulator that simulates a relay node. As shown in FIG. 1, the relay node simulator 1 is interposed between an eNB (base station simulator) 500 and a terminal 600 to be tested. The relay node simulator 1 includes a downlink processing unit 10, an uplink processing unit 20, a directional coupler 31, and a directional coupler 32.

The directional coupler 31 receives an RF signal (that is, base station signal) E0' from the eNB 500 and transmits this RF signal to the downlink processing unit 10. In addition, the directional coupler 31 receives a signal from the uplink processing unit 20 and transmits this signal to the eNB 500.

The downlink processing unit 10 is a processing block that simulates processing relating to a downlink of the relay node. The downlink processing unit 10 receives an analog RF signal E0' that is transmitted from the eNB 500 through the directional coupler 31. The downlink processing unit 10 generates a baseband signal E1 as an output of the relay node on the basis of the signal transmitted from the eNB 500, synthesizes a baseband signal E0 transmitted from the eNB 500 and the baseband signal E1 to carry out conversion into an RF signal, and transmits this RF signal to the terminal 600 to be tested as a test signal. Detailed configuration and operation of the downlink processing unit 10 will be described later.

The directional coupler 32 receives the test signal transmitted from the downlink processing unit 10 and transmits this test signal to the terminal 600 to be tested. In addition, the directional coupler 32 receives the signal transmitted from the terminal 600 to be tested and transmits this signal to the uplink processing unit 20.

The uplink processing unit 20 is a processing block that simulates processing relating to an uplink of the relay node. The uplink processing unit 20 receives an analog RF signal transmitted from the terminal 600 to be tested through the directional coupler 32. The uplink processing unit 20 demodulates this RF signal and decodes this demodulated RF signal to digital data on the basis of a predetermined communication method. Among decoded digital data, the uplink processing unit 20 rewrites data corresponding to a control signal on the basis of setting of the relay node. The uplink processing unit 20 encodes this digital data on the basis of a predetermined communication method, modulates this encoded digital data to an analog RF signal, and transmits this RF signal to the eNB 500. In addition, a specific operation of this uplink processing unit 20 is defined by "3GPP TS36.211 V10.0.0" and the like.

Figure 3:
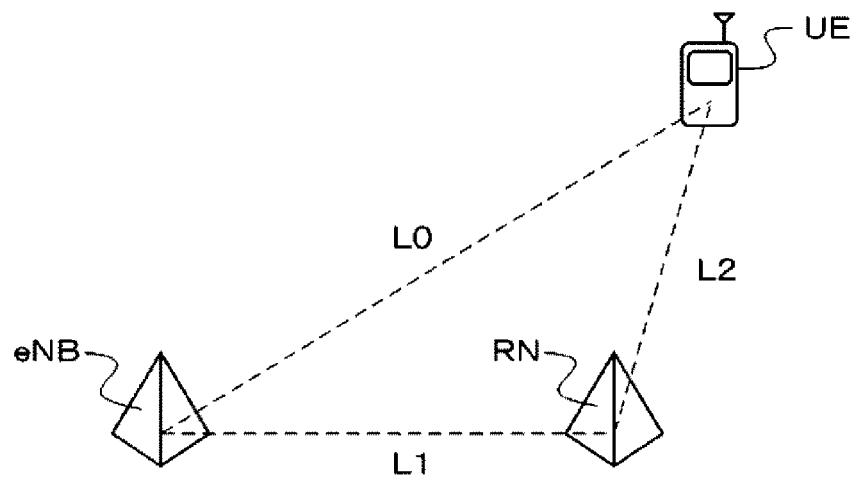
FIG. 3 is a schematic diagram illustrating a positional relationship between a base station, a relay node, and a mobile communication terminal.

Next, details of the downlink processing unit 10 will be described. First, reference is made to FIG. 3. FIG. 3 show a diagram schematically illustrating a positional relationship between a base station eNB, a relay node RN, and a mobile communication terminal UE. For example, the distance between the base station eNB and the mobile communication terminal UE is set to L0, and the distance between the base station eNB and the relay node RN is set to L1, and the distance between the relay node RN and the mobile communication terminal UE is set to L2.

Figure 4A:
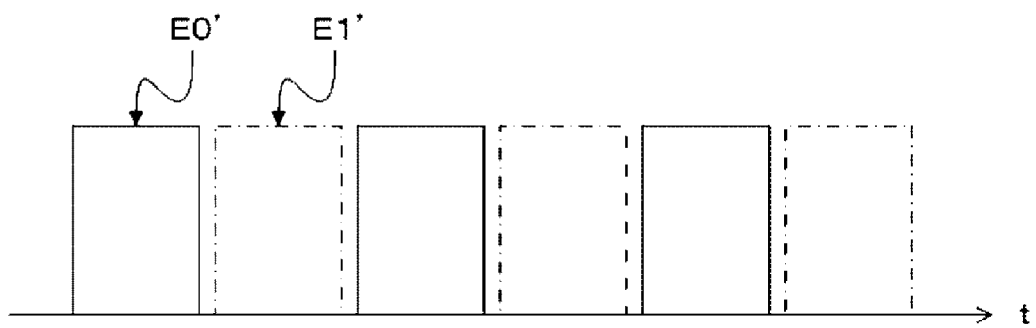
FIG. 4A is a schematic diagram illustrating a relationship between a signal transmitted from the base station and a signal transmitted from the relay node.

In a case where this relay node RN is a layer 3 relay node, an RF signal E0' that is transmitted from the base station eNB, and an RF signal E1' that is obtained by relaying the RF signal E0' and is output from the relay node RN are dealt with as different signals. In this case, when the RF signal E0' and the RF signal E1' are transmitted by the same frequency, a transmitted signal (RF signal E1') from the relay node RN may be wrapped around to a reception side (RF signal E0') of the relay node RN and may interfere with the reception side. Therefore, in this case, the relay node RN carries out reception of the RF signal E0' transmitted from the base station eNB and transmission of the RF signal E1' to the mobile communication terminal UE in a time division manner. In this case, the RF signal E0', which is transmitted from the base station eNB, is time-divided for each sub-frame and is transmitted to the mobile communication terminal or the relay node at a predetermined timing. The relay node RN receives the RF signal E0' in accordance with this timing and transmits the RF signal E1' at a timing different from the reception of the RF signal E0' to the mobile communication terminal UE. In an area that may receive both the RF signal E0' and the RF signal E1', the RF signal E0' and the RF signal E1' are transmitted to the mobile communication terminal UE in a time division manner. FIG. 4A schematically shows a relationship between the RF signal E0' and the RF signal E1' in this case.

Figure 4B:
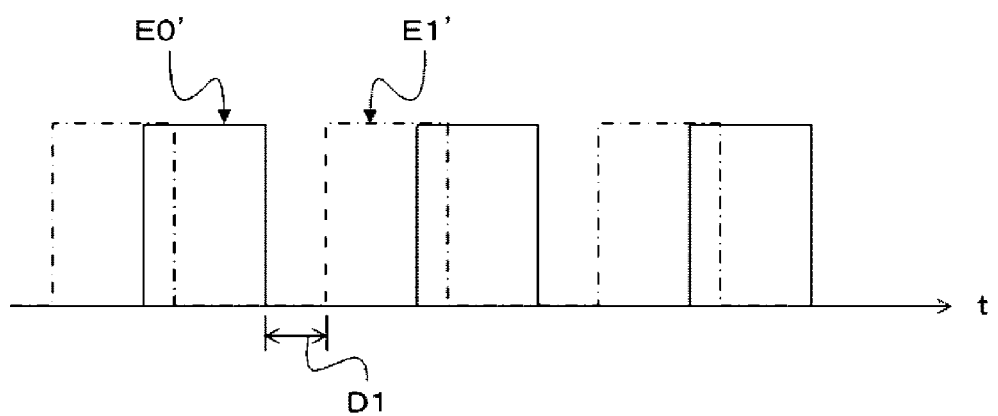
FIG. 4B is a schematic diagram illustrating a relationship between a signal transmitted from the base station and a signal transmitted from the relay node.
Figure 4C:
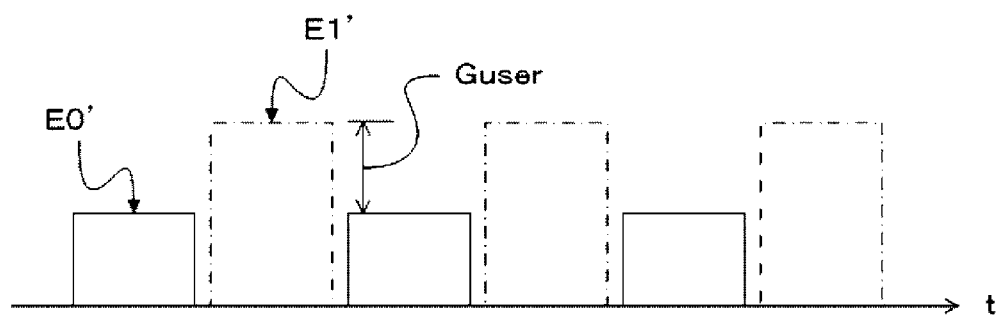
FIG. 4C is a schematic diagram illustrating a relationship between a signal transmitted from the base station and a signal transmitted from the relay node.

Ideally, the mobile communication terminal UE receives the RF signal E1' and the RF signal E0' in a time division manner as shown in FIG. 4A. However, attenuation and delay of this signal may occur in correspondence with a positional relationship between the base station eNB, the relay node RN, and the mobile communication terminal UE. Hereinafter, for easy comprehension, description will be made on the assumption that a signal output level of the base station eNB and a signal output level of the relay node RN are the same as each other. For example, FIG. 4B illustrates a case in which delay occur in the RF signal E1'. In this case, interference occurs between the RF signal E0' and the RF signal E1'. In addition, the RF signal E0' is attenuated in response to the distance L0. For example, FIG. 4C shows a case of the distance L0>L2. In this case, a level of the RF signal E0' becomes lower than the RF signal E1'. The downlink processing unit 10 of the relay node simulator relating to this embodiment simulates this environment, and tests an operation of the terminal 600 to be tested, which corresponds to the mobile communication terminal UE. In addition, in this case, the eNB 500 corresponds to the base station eNB, and the downlink processing unit 10 simulates a level difference and relay between a signal transmitted from the base station eNB and a signal transmitted from the relay node RN, which corresponds to a difference in distance between the distance L0 and the distance L2 with a downlink processing portion of the relay node RN. Specifically, the downlink processing unit 10 receives the RF signal E0' from the eNB 500, on the basis of this signal, generates a test signal in which the RF signal E0' and the RF signal E1' added, and transmits the test signal to the terminal 600 to be tested (that is, the mobile communication terminal).

Figure 2A:
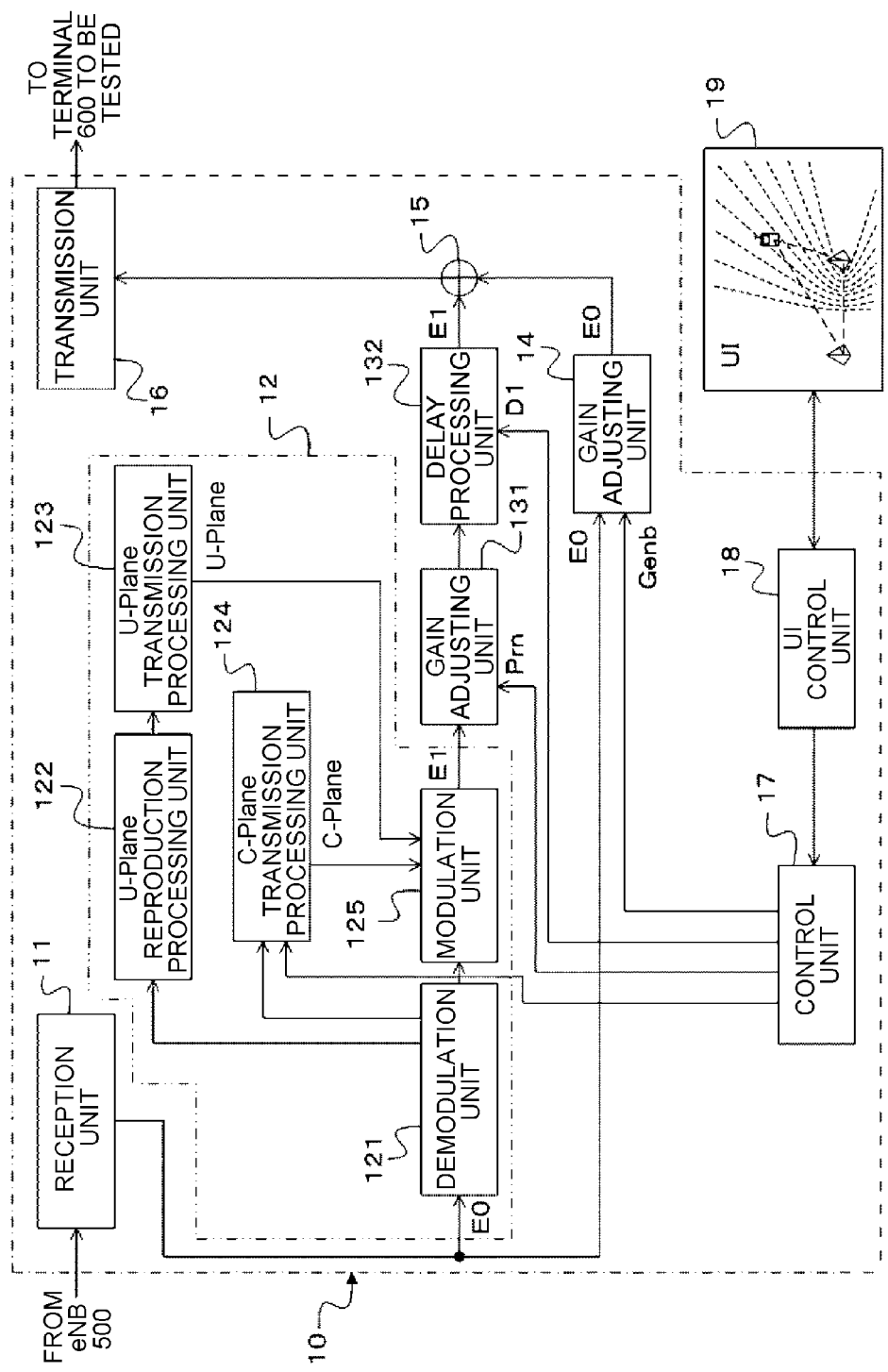
FIG. 2A is a block diagram illustrating a detailed configuration of a downlink processing unit.

A description will be made with respect to a configuration of the downlink processing unit 10 with reference to FIG. 2A. FIG. 2A shows a block diagram illustrating a detailed configuration of the downlink processing unit 10. As shown in FIG. 2A, the downlink processing unit 10 includes a reception unit 11, a relay processing unit 12, a gain adjusting unit 131, a delay processing unit 132, a gain adjusting unit 14, an adder 15, a transmission unit 16, a control unit 17, and an UI control unit 18. The relay processing unit 12 is configured to simulates baseband signal processing of an actual relay node, and is configured to generate a baseband signal that the actual relay node have to generate. The baseband signal that the relay node has to generate is a baseband signal corresponding to an RF signal that the relay node transmits to the mobile communication terminal. The relay processing unit 12 includes a demodulation unit 121, a U-Plane reproduction processing unit 122, a U-Plane transmission processing unit 123, a C-Plane transmission processing unit 124, and a modulation unit 125.

The reception unit 11 receives the RF signal E0' that is transmitted from the eNB 500 in a time division manner on the basis of a predetermined timing. The reception unit 11 carries out frequency conversion of the received RF signal into an IF (intermediate frequency) signal, and carries out A/D conversion of this IF signal to perform frequency shift, thereby obtaining a digital baseband signal E0. The baseband signal E0 is a baseband signal corresponding to the RF signal E0'. The reception unit 11 outputs the baseband signal E0 to the demodulation unit 121 and the gain adjusting unit 14, respectively.

The demodulation unit 121, the U-Plane reproduction processing unit 122, the U-Plane transmission processing unit 123, the C-Plane transmission processing unit 124, and the modulation unit 125 correspond to a configuration of portions that carry out demodulation and decoding processing, and encoding and modulating processing. Therefore, this configuration operates on the basis of a communication method protocol (for example, 3GPP TS36.211 V10.0.0) that is determined in advance. Hereinafter, an example of this configuration will be described.

The demodulation unit 121 receives the baseband signal E0 from the reception unit 11 and carries out demodulation processing. This demodulated signal has a frame structure based on an encoding method (for example, OFDMA) corresponding to a predetermined communication method (LTE).

The demodulation unit 121 decodes the demodulated signal on the basis of the above-described predetermined communication method and fetches digital data. The demodulation unit 121 outputs the fetched digital data to the U-Plane reproduction processing unit 122. In addition, the demodulation unit 121 transmits information for carrying out generation of C-Plane to the C-Plane transmission processing unit 124. In addition, the demodulation unit 121 informs the modulation unit 125 of synchronization timing of the baseband signal E0.

Here, a protocol configuration of digital data that is fetched after decoding the demodulated signal will be described. This data includes a U-Plane (User Plane) protocol and a C-Plane (Control Plane) protocol. The U-Plane protocol is a protocol that deals with use data. Hereinafter, the U-Plane protocol is simply referred to as a U-Plane. In addition, the C-Plane protocol is a protocol that deals with data for carrying out control. Hereinafter, the C-Plane protocol is simply referred to as a C-Plane.

The U-Plane reproduction processing unit 122 receives digital data from the demodulation unit 121. The U-Plane reproduction processing unit 122 reproduces the U-Plane from the digital data on the basis of control information included in the C-Plane of the digital data. The U-Plane reproduction processing unit 122 outputs the reproduced U-Plane to the U-Plane transmission processing unit 123.

The U-Plane transmission processing unit 123 receives the U-Plane from the U-Plane reproduction processing unit 122. The U-Plane transmission processing unit 123 has a radio control function that is the same as that of the base station. This radio control function includes, for example, a PDCP (Packet Data Convergence Protocol) sublayer, an RLC (Radio Link Control) sublayer, a MAC (Medium Access Control) sublayer, and an RRC (Radio Resource Control) sublayer. The PDCP sublayer carries out user data hiding, header compression, and the like. In addition, the RLC sublayer carries out retransmission control by ARQ (Automatic Repeat request), division and coupling of an SDU (Service Data Unit), sequence control, and the like. In addition, the MAC sublayer carries out scheduling of HARQ and user data, and the like. In addition, the RRC sublayer carries out mobility, QoS, and security control. The U-Plane transmission processing unit 123 carries out such radio control with respect to the U-Plane that is received. The U-Plane transmission processing unit 123 outputs the U-Plane to which the radio control is carried out to the modulation unit 125.

The C-Plane transmission processing unit 124 receives information transmitted from the demodulation unit 121 and the control unit 17 and generates data, that is, the C-Plane for controlling the network between the relay node RN that simulated by the downlink processing unit 10 and the terminal 600 to be tested. On the basis of this generated C-Plane, for example, setting of a transmission path between the relay node RN that is simulated and the terminal 600 to be tested, control of handover, and the like are carried out. The C-Plane transmission processing unit 124 outputs the generated C-Plane to the modulation unit 125.

The modulation unit 125 receives the U-Plane from the U-Plane transmission processing unit 123. In addition, the modulation unit 125 receives the C-Plane from the C-Plane transmission processing unit 124. The modulation unit 125 generates digital data by the received C-Plane and the U-Plane. The modulation unit 125 encodes and digital-modulates the generated digital data on the basis of a predetermined communication method to generate a baseband signal. In addition, the modulation unit 125 receives synchronization timing from the demodulation unit 121. The modulation unit 125 carries out delay processing with respect to this baseband signal to delay processing in order for the generated baseband signal to synchronize with the informed synchronization timing. The modulation unit 125 outputs the baseband signal E1 to which the delay processing is carried out to the gain adjusting unit 131.

The gain adjusting unit 131 receives the baseband signal E1 from the modulation unit 125. In addition, the gain adjusting unit 131 receives information, which represents a signal level Prn that is set in advance as a measuring condition and that is output from the relay node, from the control unit 17. The gain adjusting unit 131 determines gain in such a manner the level of the baseband signal E1 becomes the level Prn, and adjusts a level of the baseband signal E1 with the gain.

In addition, the gain adjusting unit 131 may calculate an amount of attenuation of the baseband signal E1 between the relay node RN and the terminal 600 to be tested (that is, mobile communication terminal UE), which is assumed as a real line, and may adjust the gain in such a manner that the level of the baseband signal E1 becomes a level that is attenuated from the level Prn by this amount of attenuation. In this case, the gain adjusting unit 131 may receive information that represents the distance (for example, distance L2), which is set in advance, between the relay node and the terminal 600 to be tested from the control unit 17, and may calculate the amount of attenuation of the baseband signal on the basis of information representing this distance.

The gain adjusting unit 131 outputs the baseband signal E1 whose level is adjusted to the delay processing unit 132.

The delay processing unit 132 receives the baseband signal E1 whose level is adjusted from the gain adjusting unit 131. In addition, the delay processing unit 132 receives information representing an amount of delay D1 from the control unit 17. In addition, the delay processing unit 132 applies an amount of delay D1 to the baseband signal E1. In addition, as described later, the baseband signals E0 and E1 are added and thus frequency conversion thereof is carried out, thereby obtaining an RF signal that is a test signal. An RF signal E0' obtained by frequency conversion of the baseband signal E0 and an RF signal E1' obtained by frequency conversion of the baseband signal E1 are included in the test signal. Here, FIG. 4B shows a relationship between the RF signal E1' to which delay is given by the delay processing unit 132 and the RF signal E0' that is transmitted from the eNB 500. In this manner, delay of the RF signal E1' based on the positional relationship between the base station eNB, the relay node RN, and the mobile communication terminal UE is simulated by giving an amount of delay D1 to the RF signal E1' by the delay processing unit 132. In this manner, interference between the RF signal E0' and the RF signal E1' due to the delay may be simulated. The delay processing unit 132 outputs the baseband signal E1 to which the delay is given to the adder 15.

Next, a description is given to a configuration relating output of the baseband signal E0 in the downlink processing unit 10. The downlink processing unit 10 simulates attenuation of the RF signal E0' due to the distance L0 between the eNB 500 (that is, the base station eNB) and the terminal 600 to be tested (that is, the mobile communication terminal UE) as shown in FIG. 4C by outputting the baseband signal E0 after adjusting a level thereof. This simulation configuration is the gain adjusting unit 14. Hereinafter, each configuration will be described. In addition, the relay node simulator of the present invention carries out frequency conversion of the baseband signal, whose level is adjusted, into an RF signal, and outputs the RF signal whose level is controlled.

The gain adjusting unit 14 receives the baseband signal E0 from the reception unit 11. In addition, the gain adjusting unit 14 receives information representing gain Genb from the control unit 17. The gain adjusting unit 14 adjusts the level of the baseband signal E0 by attenuating or amplifying the level of the baseband signal E0 by the gain Genb. Therefore, the level of the baseband signal E0 is adjusted to a level Penb' as shown in FIG. 4C. Therefore, the attenuation of the RF signal E0', which corresponds to the distance L0 between the base station eNB and the mobile communication terminal UE, may be simulated. The gain adjusting unit 14 outputs the baseband signal E0 whose level is adjusted to the adder 15.

The adder 15 receives the baseband signal E1 to which delay is applied from the delay processing unit 132. The adder 15 receives the baseband signal E0 whose level is adjusted from the gain adjusting unit 14. The adder 15 adds the baseband signal E0 and the baseband signal E1 and outputs an added signal to the transmission unit 16. The transmission unit 16 carries out D/A conversion and frequency conversion with respect to the added signal and outputs an RF signal, which is obtained after the D/A conversion and the frequency conversion, to the terminal 600 to be tested as a test signal.

The control unit 17 receives measurement conditions that are designated by an operator or setting information of the relay node RN from an UI control unit 18 through an UI 19. The control 17 receives the level Prn, the gain Genb, and the amount of delay D1 that are instructed as measurement conditions. The control unit 17 outputs the level Prn to the gain adjusting unit 131. In response to this, the gain adjusting unit 131 adjusts the level of the baseband signal E1. In addition, the control unit 17 outputs information representing the amount of delay D1 to the delay processing unit 132. In response to this, the delay processing unit 132 gives the amount of delay D1 to the baseband signal E1. In addition, the control unit 17 outputs the level Prn and the gain Genb to the gain adjusting unit 14. In response to this, the gain adjusting unit 14 adjusts the level of the baseband signal E0.

The control unit 17 receives setting information of the relay node RN (for example, discrimination information of the relay node RN), which is input by the operator through the UI 19, from the UI control unit 18. The control unit 17 transmits information, which is necessary for generating the C-Plane, among pieces of setting information to the C-Plane transmission processing unit 124.

The UI control unit 18 allows an operation screen for designating the measurement conditions or the setting information of the relay node RN to be displayed in UI 19. In addition, the UI control unit 18 receives an instruction given by the operator, which is based on this operation screen, from the UI 19, generates information thereof, and output the generated information to the control unit 17. In this manner, the control unit 17 may control operation of each configuration of the downlink processing unit 10 on the basis of the measurement conditions or setting information that is designated by the operator.

Figure 5A:
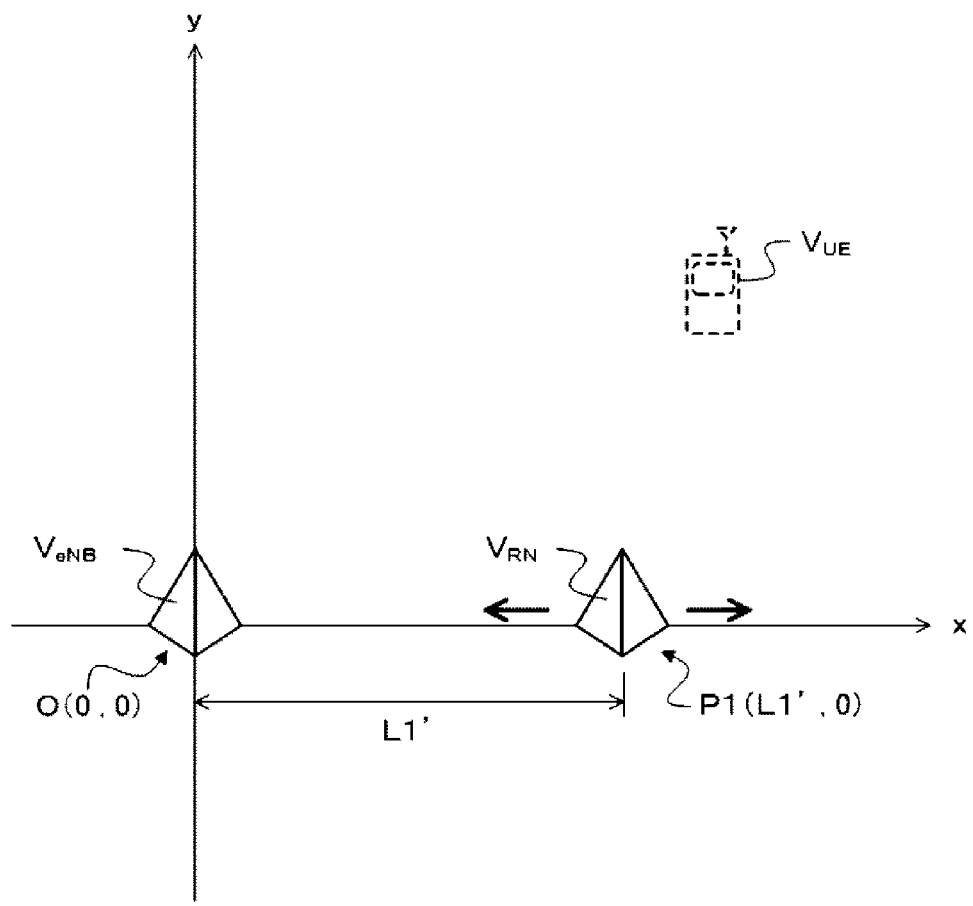
FIG. 5A is a diagram illustrating an operation method of an UI according to the present invention.
Figure 5B:
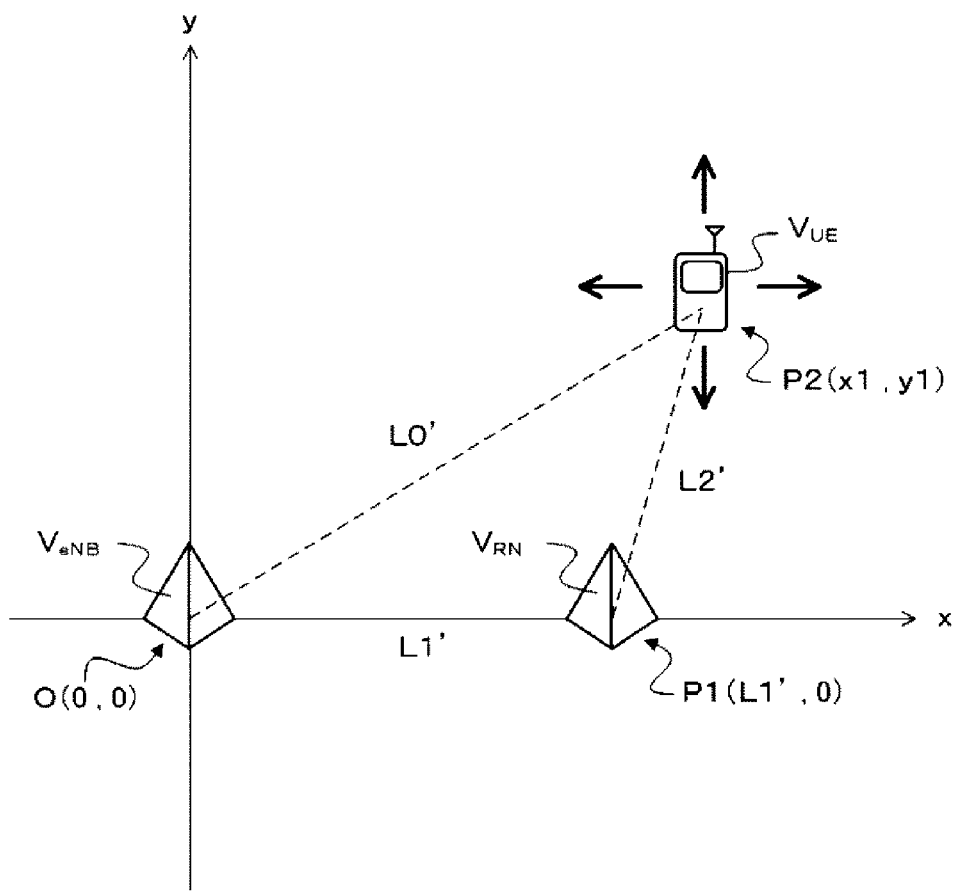
FIG. 5B is a diagram illustrating an operation method of an UI according to the present invention.

In addition, the UI control unit 18 allows an operation screen including a base station marker $V_{eNB}$, a relay node marker $U_{RN}$, and a terminal marker $V_{UE}$ to be displayed in the UI 19. The base station marker $V_{eNB}$ simulates the base station eNB. In addition, the relay node marker $V_{RN}$ simulates the relay node RN. In addition, the terminal marker $V_{UE}$ simulates the mobile communication terminal UE. The UI control unit 18 receives position designation of the base station marker $V_{eNB}$, the relay node marker $V_{RN}$, and the terminal marker $V_{UE}$ by the operator through the UI 19, and determines the amount of delay D1, the gain Genb, and the level Prn on the basis of these positions. Hereinafter, first, a configuration of this operation screen will be described with reference to FIGS. 5A and 5B. Then, a description will be made with respect to detailed operation relating to creation and display of the operation screen together with a detailed configuration of the UI control unit 18. FIGS. 5A and 5B shows an example of the operation screen and are diagrams for explaining an operation method of this operation screen.

(Configuration of Operation Screen)

As shown in FIGS. 5A and 5B, the operation screen for designating delay and gain includes the base station marker $V_{eNB}$, the relay node marker $V_{RN}$, and the terminal marker $V_{UE}$. These markers are correlated to a common coordinate system that is determined in advance. In addition, hereinafter, when being described simply as a "coordinate system", this is assumed to represent the common coordinate system. In an example shown in FIGS. 5A and 5B, the horizontal axis is set to an x-axis, and the vertical axis is set to a y-axis. This operation screen is configured to designate a positional relationship between the base station eNB, the relay node RN, and the mobile communication terminal UE in an actual environment by disposing the respective marker on the above-described coordinate system.

First, reference is made to FIG. 5A. On the operation screen, the base station marker $V_{eNB}$ is fixed at a predetermined position (for example, the origin O(0, 0)) on the coordinate system. In addition, the relay node marker $V_{RN}$ is configured to be movable in a predetermined direction (in one-dimension) with the base station marker $V_{eNB}$ being set as a starting point. In the example in FIG. 5A, the base station marker $V_{eNB}$ is configured to be movable along the x-direction. When the position of the base station marker $V_{eNB}$ is designated, the distance L1' between the base station marker $V_{eNB}$ and the relay node marker $V_{RN}$ on the coordinate system is calculated by delay amount calculating unit 183 included in the UI control unit 18. The distance L1 between the base station eNB and the relay node RN in an actual environment is calculated on the basis of the distance L1'. Details of configuration and operation of the delay amount calculating unit 183 will be described later. In addition, in the calculation, a relative position between the base station marker $V_{eNB}$ and the relay node marker $V_{RN}$ may be used, and for example, the position of the relay node marker $V_{RN}$ may be fixed and the base station marker $V_{eNB}$ may be made to be movable in one-dimension. In addition, hereinafter, a description will be made on the assumption that the base station marker $V_{eNB}$ is fixed.

Next, reference is made to FIG. 5B. When positions of the base station marker $V_{eNB}$ and the relay node marker $V_{RN}$ are designated, the terminal marker $V_{UE}$ is displayed on the coordinate system in such a manner that the position thereof can be designated. At this time, movement of the terminal marker $V_{UE}$ is not particularly restricted, and is displayed to be movable in two-dimension. When the position of the terminal marker $V_{UE}$ is designated, the distance L0' between the terminal marker $V_{UE}$ and the base station marker $V_{eNB}$ and the distance L2' between the terminal marker $V_{UE}$ and the relay node marker $V_{RN}$ on the coordinate system are calculated. On the basis of the distance L0', the distance L0 between the mobile communication terminal UE and the base station eNB in an actual environment is calculated. In addition, on the basis of the distance L2', the distance L2 between the mobile communication terminal UE and the relay node RN in an actual environment is calculated.

Figure 6A:
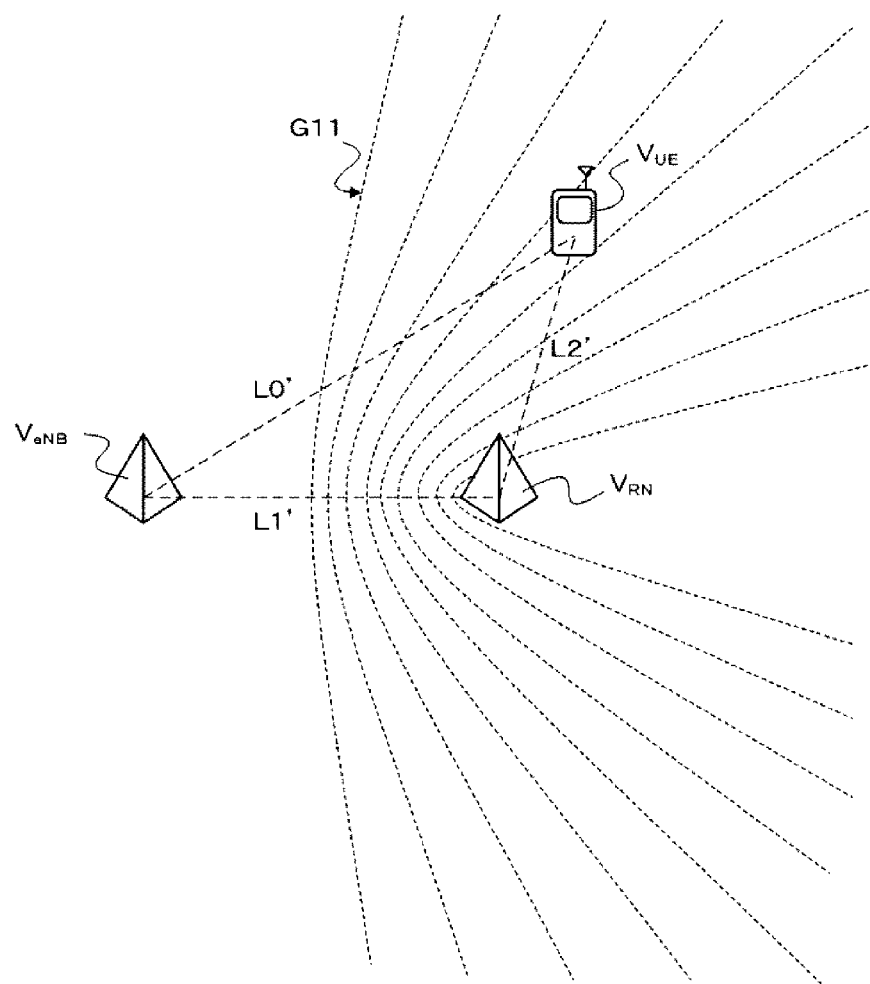
FIG. 6A is an example of a pattern that is displayed on the UI.

In addition, when the positions of the base station marker $V_{eNB}$ and the relay node marker $V_{RN}$ are specified in the operation screen relating to the present invention, the delay amount calculating unit 183 calculates the amount of delay D1 between the RF signal E0' and the RF signal E1' at each position on the coordinate system. Then, a pattern display controlling unit 1822 allows a pattern G11, which presents the amount of delay D1 in a discriminable manner, to be displayed on the operation screen. Details of the pattern display control unit 1822 will be described later. FIG. 6A shows an example of the pattern G11. In FIG. 6A, a variation in the amount of delay D1, which corresponds to each position on the coordinate system, is displayed in a discriminable manner by drawing isolines on the basis of each amount of delay D1 that is calculated. In addition, configuration and operation relating to creation of the pattern G11 will be described later together with configuration of the pattern display control unit 1822. When the position of the terminal marker $V_{UE}$ is changed, due to the pattern G11, the operator may easily discriminate the variation of the amount of delay D1 at each position. In addition, the pattern G11 corresponds to "a first pattern".

Figure 6B:
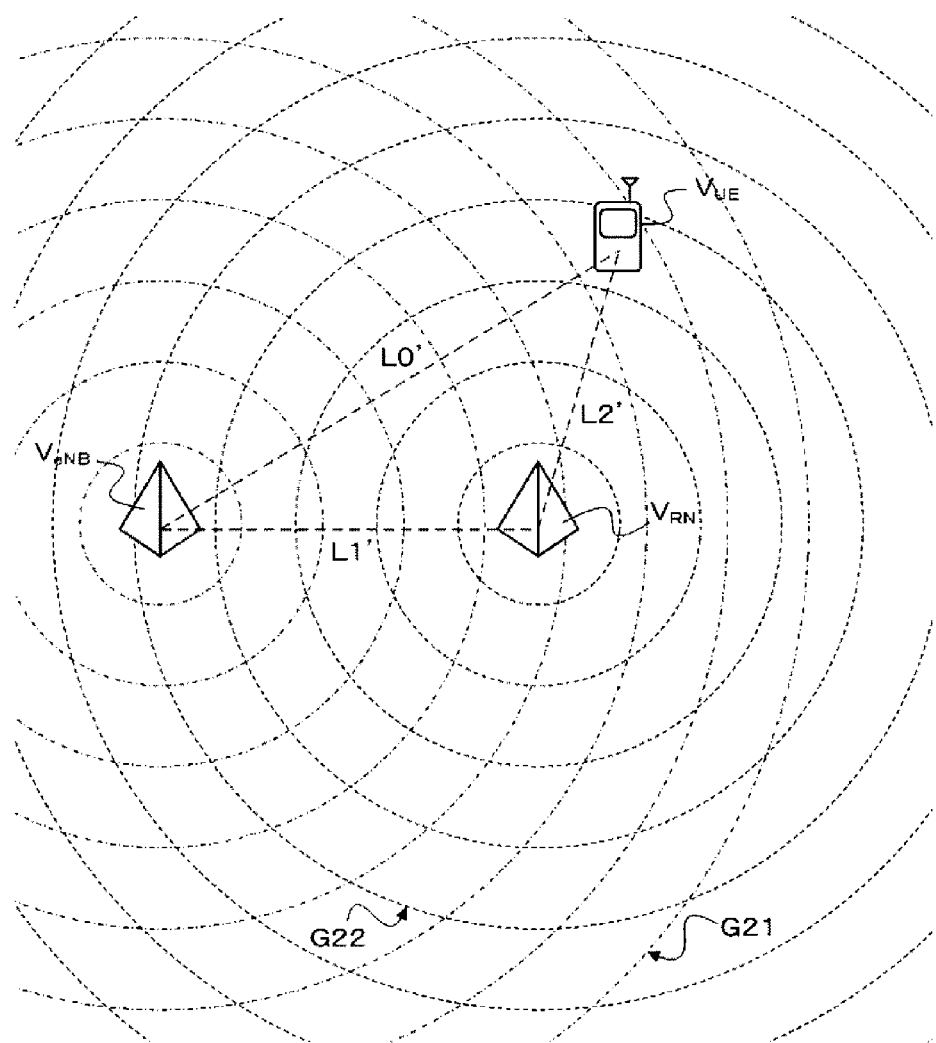
FIG. 6B is an example of a pattern that is displayed on the UI.

In addition, respective amounts of attenuation of the RF signal E0' and the RF signal E1' at each position on the coordinate system is calculated, and then a pattern G21 and a pattern G22, which present the amounts of attenuation in a discriminable manner, may be allowed to be displayed. FIG. 6B shows an example of the pattern G21 and the pattern G22. In FIG. 6B, amounts of attenuation of the RF signal E0' and the RF signal E1' at each position on the coordinate system are displayed in a discriminable manner by drawing isolines on the basis of the respective amounts of attenuation that are calculated. In addition, configuration and operation relating to creation of the patterns G21 and G22 will be described later. Due to these patterns G21 and G22, the operator may easily discriminate a variation of the amounts of attenuation of the RF signal E0' and the RF signal E1' at each position in accordance with a relative position between the base station marker $V_{eNB}$ and the relay node marker $V_{RN}$.

Figure 6C:
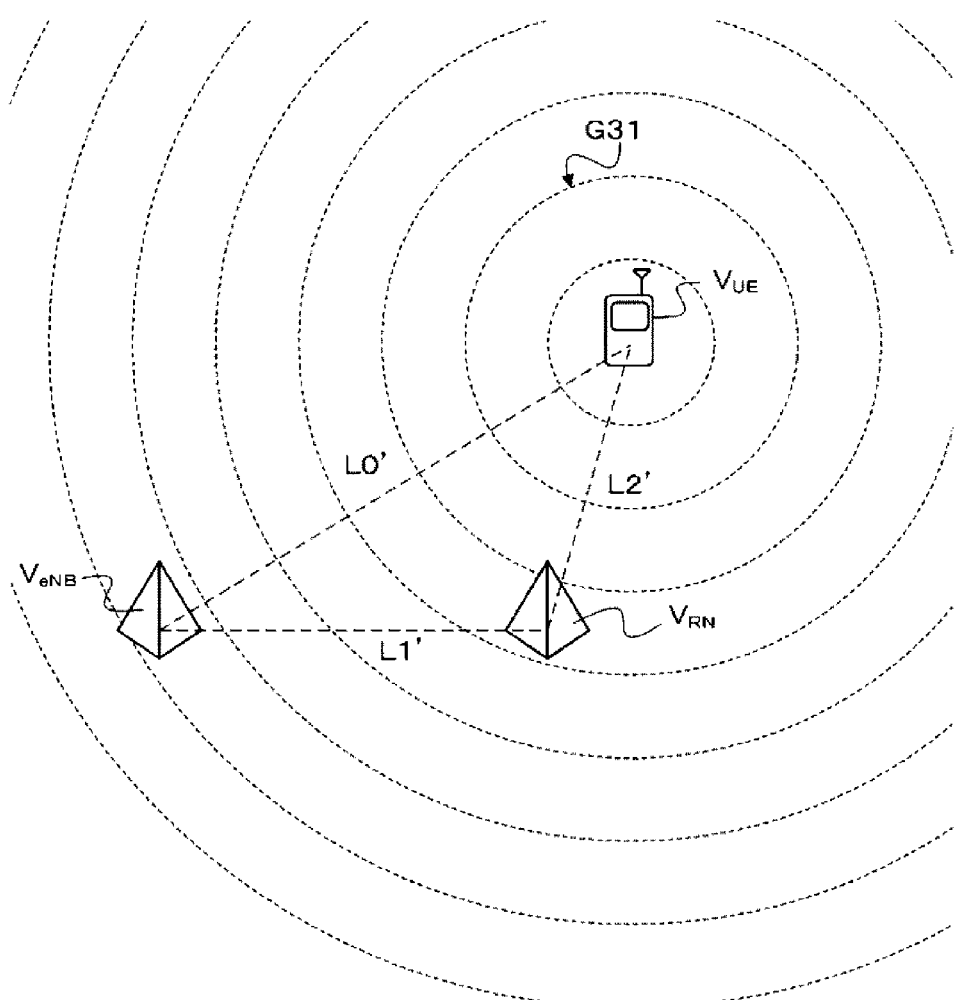
FIG. 6C is an example of a pattern that is displayed on the UI.

In addition, when receiving positional designation of the terminal marker $V_{UE}$, an amount of attenuation of a signal transmitted from the mobile communication terminal UE at each position on the coordinate system may be calculated, and a pattern G31, which presents this amount of attenuation, may be displayed in a discriminable manner. FIG. 6C shows an example of the pattern G31. In FIG. 6C, the amount of attenuation at each position on the coordinate system is displayed in a discriminable manner by drawing isolines on the basis of each amount of attenuation that is calculated. Due to the pattern G31, the operator may easily discriminate a variation of the amount of attenuation of a signal transmitted from the mobile communication terminal UE at each position corresponding to the position of the terminal marker $V_{UE}$. In addition, the patterns G21, G22, and G31 correspond to "second pattern".

(Configuration of UI Control Unit 18)

Next, a detailed configuration of the UI control unit 18 will be described with reference to FIG. 2B. FIG. 2B shows a block diagram illustrating a configuration of the UI control unit 18. As shown in FIG. 2B, the UI control unit 18 includes a position specifying unit 181, a display control unit 182, a delay amount calculating unit 183, a gain calculating unit 184, a setting information storage unit 185, and a setting information output unit 186. In addition, the display control unit 182 includes a marker display control unit 1821, a pattern display control unit 1822, and a setting information display control unit 1823.

The position specifying unit 181 receives information (hereinafter, referred to as "position information"), which represents the position of the relay node marker $V_{RN}$ that is designated by the operator, from the UI 19. For example, in the case FIG. 5A, the position specifying unit 181 receives coordinates P1(L1', 0), which represent the position of the relay node marker $V_{RN}$, as position information from the UI 19. The position specifying unit 181 outputs position information of the relay node marker $V_{RN}$ to the display control unit 182. In response to this, the display control unit 182 updates a display position of the relay node marker $V_{RN}$ on the operation screen and allows this operation screen to be displayed on the UI 19. In addition, the position specifying unit 181 outputs respective pieces of position information of the base station marker $V_{eNB}$ and the relay node marker $V_{RN}$ to the delay amount calculating unit 183 and the gain calculating unit 184, respectively.

In addition, after specifying the position of the relay node marker $V_{RN}$, the position specifying unit 181 receives information, which represents the position of the terminal marker $V_{UE}$ that is designated by the operator, from the UI 19. For example, in the case of FIG. 5B, the position specifying unit 181 receives coordinates P2(x1, y1), which represents the position of the terminal marker $V_{UE}$, as position information from the UI 19. The position specifying unit 181 outputs the position information of the terminal marker $V_{UE}$ to the display control unit 182. In response to this, the display control unit 182 updates a display position of the terminal marker $V_{UE}$ on the operation screen and allows this operation screen to be displayed on the UI 19. In addition, the position specifying unit 181 outputs the position information of the terminal marker $V_{UE}$ to the delay amount calculating unit 183 and the gain calculating unit 184.

The delay amount calculating unit 183 receives respective pieces of position information of the base station marker $V_{eNB}$ and the relay node marker $V_{RN}$ from the position specifying unit 181. The delay amount calculating unit 183 calculates the distance L1' between the base station marker $V_{eNB}$ and the relay node marker $V_{RN}$ on the basis of these pieces of position information. With respect to each position (hereinafter, referred to as a "sampling point") on the coordinate system, the delay amount calculating unit 183 calculates the distance L0' between a position thereof and the base station marker $V_{eNB}$, and L2' between the position and the relay node marker $V_{RN}$, respectively. The delay amount calculating unit 183 calculates a difference $D_{diff}$ between the distance L0' and the distance L1'+L2' on the basis of L1', L0', and L2' that are calculated. $D_{diff}$ is calculated by the following Expression 1 on the basis of coordinates O(0,0) of the base station marker $V_{eNB}$, coordinates P1(L1',0) of the relay node marker $V_{RN}$, and coordinates P2(x1,y1) of the terminal marker $V_{UE}$. In addition, the distance between sampling points in which the difference $D_{diff}$ is calculated, that is, resolution may be appropriately changed.

$$D_{diff} = L1' + \sqrt{(x1-L1')^2 + y1^2} - \sqrt{x1^2 + y1^2} \qquad \text{[Expression 1]}$$

In addition, the distance L0 in an actual environment, which corresponds to the distance L0', represents the distance between the base station eNB and the mobile communication terminal UE. In addition, the distance L1+L2 in an actual environment, which corresponds to the distance L1'+L2', represents the distance until reaching the mobile communication terminal UE from the base station eNB through the relay node RN.

The delay amount calculating unit 183 converts the $D_{diff}$ that is calculated for each sampling point into a distance on an actual environment on the basis of information that is determined in advance and that represents a contraction scale between a distance on the operation screen and a distance on an actual environment. The delay amount calculating unit 183 divides the calculated distance by a propagation velocity c of a signal to calculate the amount of delay D1 at each sampling point, and correlates this amount of delay D1 to the position information at the sampling point. The delay amount calculating unit 183 outputs the position information, to which the information representing the amount of delay D1 is correlated, of each sampling point to the pattern display control unit 1822. The pattern display control unit 1822 will be described later.

In addition, after the positions of the base station marker $V_{eNB}$ and the relay node marker $V_{RN}$ are specified, the delay amount calculating unit 183 receives position information of the terminal marker $V_{UE}$ from the position specifying unit 181. The delay amount calculating unit 183 specifies a sampling point corresponding to the received position information and extracts the amount of delay D1 that is correlated to the sampling point. The delay amount calculating unit 183 outputs the amount of delay D1 that is extracted to the control unit 17. Due to this, the amount of delay D1 is set by the delay processing unit 132 via the control unit 17. In addition, when receiving position information of the terminal marker $V_{UE}$, the delay amount calculating unit 183 may be operated to calculate the amount of delay D1 corresponding to the position on the basis of Expression 1 and to output the amount of delay D1 that is calculated to the control unit 17.

In addition, when receiving position information of the terminal marker $V_{UE}$, the delay amount calculating unit 183 may calculate on the basis of position information of the base station marker $V_{eNB}$, relay node marker $V_{RN}$, and terminal marker $V_{UE}$, and may calculate the amount of delay D1 on the basis of this $D_{diff}$. In this operation, the amount of delay D1 may be strictly calculated on the basis of position information of the respective markers.

The gain calculating unit 184 receives respective pieces of position information of the base station marker $V_{eNB}$ and the relay node marker $V_{RN}$ from the position specifying unit 181. With respect to each sampling point, the gain calculating unit 184 calculates the distance L0' between a position of the sampling point and the base station marker $V_{eNB}$ and the distance L2' between this position and the relay node marker $V_{RN}$ on the basis of these pieces of position information.

The gain calculating unit 184 converts the distances L0' and L2' that are calculated for each sampling point into distances L0 and L2 on an actual environment on the basis of information that is determined in advance and that represents a contraction scale between the distance on the operation screen and the distance on an actual environment. The gain calculating unit 184 calculates an amount of attenuation Genb' of the RF signal E0' at each sampling point on the basis of the distance L0 that is calculated. This amount of attenuation Genb' represents an amount of attenuation of the RF signal E0' that is transmitted from the base station eNB until this RF signal E0' reaches a sampling point that is spaced by a distance L0. In addition, the gain calculating unit 184 calculates an amount of attenuation Grn' of the RF signal E1' at each sampling point on the basis of the distance L2 that is calculated. This amount of attenuation Grn' represents an amount of attenuation of the RF signal E1' that is transmitted from the relay node RN until this RF signal E1' reaches a sampling point that is distant therefrom by a distance L2. The gain calculating unit 184 correlates the amount of attenuation Genb' and the amount of attenuation Grn', which are calculated for each sampling point, to position information of the sampling point. The gain calculating unit 184 outputs the position information, which is correlated to the amount of attenuation Genb' and the amount of attenuation Grn', of each sampling point to the pattern display control unit 1822.

In addition, after the positions of the base station marker $V_{eNB}$ and the relay node marker $V_{RN}$ are specified, the gain calculating unit 184 receives position information of the terminal marker $V_{UE}$ from the position specifying unit 181. With respect to each sampling point, the gain calculating unit 184 calculates the distance L3' between the position of the sampling point and the terminal marker $V_{UE}$. The gain calculating unit 184 converts the distance L3' that is calculated for each sampling point into a distance L3 on an actual environment on the basis of information that is determined in advance and that represents a contraction scale between a distance on the operation screen and a distance on an actual environment. The gain calculating unit 184 calculates an amount of attenuation Gue' of a signal transmitted from the mobile communication terminal UE at each sampling point on the basis of the distance L3 that is calculated. This amount of attenuation Gue' represents an amount of attenuation of a signal transmitted from the mobile communication terminal UE until this signal reaches a sampling point that is spaced by the distance L3. The gain calculating unit 184 correlates the amount of attenuation Gue', which is calculated for each sampling point, to position information of the sampling point. The gain calculating unit 184 outputs the position information, to which the amount of attenuation Gue' is correlated, of each sampling point to the pattern display control unit 1822.

In addition, the gain calculating unit 184 specifies the sampling point that corresponds to the received position information of the terminal marker $V_{UE}$, and extracts the amount of attenuation Genb' and the amount of attenuation Grn' that are correlated to the sampling point. The gain calculating unit 184 outputs the amount of attenuation Genb' and the amount of attenuation Grn' that are extracted to the control unit 17 as gain Genb and a level Grn. Due to this, the gain Genb and the level Grn are set in the gain adjusting units 131 and 14 via the control unit 17.

The display control unit 182 receives position information of the relay node marker $V_{RN}$ from the position specifying unit 181. The display control unit 182 outputs this position information to the marker display control unit 1821 and updates the position of the relay node marker $V_{RN}$ on the operation screen.

In addition, the display control unit 182 receives position information of the terminal marker $V_{UE}$ from the position specifying unit 181. The display control unit 182 outputs this position information to the marker display control unit 1821 and updates the position of the terminal marker $V_{UE}$ on the operation screen.

When receiving an instruction of displaying the operation screen from the UI 19, first, the marker display control unit 1821 creates an operation screen for designating a position of the relay node marker $V_{RN}$ as shown in FIG. 5A. Specifically, the marker display control unit 1821 creates an operation screen that is configured in such a manner that the base station marker $V_{eNB}$ is fixed at a predetermined position on the coordinate system, and the relay node marker $V_{RN}$ is movable in one-dimension with the base station marker $V_{eNB}$ made as a reference. The display control unit 182 outputs this operation screen that is created by the marker display control unit 1821 to the UI 19. Due to this, the operator may designate the position of the relay node marker $V_{RN}$ while operating an operation screen as shown in FIG. 5A.

Next, the marker display control unit 1821 receives the position information of the relay node marker $V_{RN}$ from the display control unit 182. The marker display control unit 1821 updates a display position of the relay node marker $V_{RN}$ on the operation screen on the basis of the this position information. In addition, when the position of the relay node marker $V_{RN}$ is specified on the basis of an instruction of the operator, the marker display control unit 1821 creates an operation screen, which is shown in FIG. 5B, for designating the position of the terminal marker $V_{UE}$. Specifically, the marker display control unit 1821 creates an operation screen that is configured in such a manner that the terminal marker $V_{UE}$ is movable in two-dimension with respect to the base station marker $V_{eNB}$ and the relay node marker $V_{RN}$. The display control unit 182 outputs this operation screen that is created by the marker display control unit 1821 to the UI 19. Due to this, the operator may designate the position of the terminal marker $V_{UE}$ while operating the operation screen as shown in FIG. 5B.

In addition, the marker display control unit 1821 receives position information of the terminal marker $V_{UE}$. The marker display control unit 1821 updates the display position of the terminal marker $V_{UE}$ on the operation screen on the basis of this position information.

After the positions of the base station marker $V_{eNB}$ and the relay node marker $V_{RN}$ are specified, the pattern display control unit 1822 receives position information, to which information representing the amount of delay D1 is correlated, of each sampling point from the delay amount calculating unit 183. The pattern display control unit 1822 correlates the received position information of each sampling point to a position on the coordinate system. Due to this, the amount of delay D1, which is correlated to the position information of the sampling point corresponding to the position on the coordinate system, is correlated to the position on the coordinate system. The pattern display control unit 1822 creates the pattern G11 displaying the amount of delay D1, which is correlated to each position on the coordinate system, in a discriminable manner. FIG. 6A shows an example of this pattern G11. Specifically, the pattern display control unit 1822 specifies sampling points at which values of the amount of delay D1 are substantially the same as each other, and creates a curved line connecting these points. The pattern display control unit 1822 carries out a process relating to the creation of the curved line for each value of the amount of delay D1 while changing this value in a predetermined range. Due to this, the pattern G11 (that, an isoline) as shown in FIG. 6A is created.

The display control unit 182 displays the pattern G11 that is created by the pattern display control unit 1822 on the operation screen shown in FIG. 5B, which is created by the marker display control unit 1821, in an overlapping manner. Due to this, in a case where the position of the terminal marker $V_{UE}$ is changed, the operator may easily discriminate a variation of the amount of delay D1 at each position. Therefore, when terminal marker $V_{UE}$ is set to a position exhibiting a desired amount of delay D1, the operator may selectively and easily set the amount of delay D1 for carrying out test.

After the positions of the base station marker $V_{eNB}$ and the relay node marker $V_{RN}$ are specified, the pattern display control unit 1822 receives position information, to which the amount of attenuation Genb' and the amount of attenuation Grn' are correlated, of each sampling point from the gain calculating unit 184. The pattern display control unit 1822 correlates the received position information of each sampling point to a position on the coordinate system. Due to this, the amount of attenuation Genb' and the amount of attenuation Grn', which are correlated to the position information of the sampling point corresponding to the position on the coordinate system, are correlated to the position on the coordinate system. The pattern display control unit 1822 creates patterns G21 and G22 that display the amount of attenuation Genb' and the amount of attenuation Grn', which are correlated to each position on the coordinate system, in a discriminable manner. FIG. 6B shows an example of these patterns G21 and G22. For example, in the case of creating the pattern G21, the pattern display control unit 1822 specifies sampling points at which values of the amount of attenuation Genb' are substantially the same as each other and creates a curve line connecting these points. The pattern display control unit 1822 carries out a process relating to the creation of the curved line for each value of the amount of attenuation Genb' while changing this value in a predetermined range. Due to this, the pattern G21 (that, an isoline) as shown in FIG. 6B is created. Similarly, in the case of the pattern G22, the pattern display control unit 1822 creates each curved line making up the pattern G22 on the basis of a value of the amount of attenuation Grn'. In addition, as it is distant from corresponding devices (the base station eNB and the relay node RN), values of the amount of attenuation Genb' and the amount of attenuation Grn' increase. Therefore, as shown in FIG. 6B, respective curved lines making up each of the patterns G21 and G22 become concentric circles with a corresponding marker made as the center.

The display control unit 182 displays the patterns G21 and G22 that are created by the pattern display control unit 1822 on the operation screen shown in FIG. 5B, which is created by the marker display control unit 1821, in an overlapping manner. Due to this, in accordance with a relative positional relationship between the base station marker $V_{eNB}$ and the relay node marker $V_{RN}$, the operator may easily discriminate a variation of the amount of attenuation of the RF signal E0' and the RF signal E1' at each position. Therefore, when the terminal marker $V_{UE}$ is set to a position exhibiting desirable amount of attenuation Genb' and the amount of attenuation Grn', the operator may selectively and easily set the amount of attenuation Genb' and the amount of attenuation Grn' for carrying out test.

In addition, after the position of the terminal marker $V_{UE}$ is specified, the pattern display control unit 1822 receives position information, to which the amount of attenuation Gue' is correlated, of each sampling point from the gain calculating unit 184. The pattern display control unit 1822 correlates the received position information of each sampling point to a position on the coordinate system. Due to this, the amount of attenuation Gue', which is correlated to the position information of the sampling point corresponding to the position on the coordinate system, is correlated to the position on the coordinate system. The pattern display control unit 1822 creates a pattern G31 that displays the amount of attenuation Gue' that is correlated to each position on the coordinate system in a discriminable manner. FIG. 6C shows an example of this pattern G31. Specifically, the pattern display control unit 1822 specifies sampling points at which values of amount of attenuation Gue' are substantially the same as each other and creates a curve line connecting the sampling points. The pattern display control unit 1822 carries out a process relating to the creation of the curved line for each value of the amount of attenuation Gue' while changing this value in a predetermined range. Due to this, the pattern G31 (that, an isoline) as shown in FIG. 6C is created. In addition, as it is distant from the mobile communication terminal UE, the value of the amount of attenuation Gue' increases. Therefore, as shown in FIG. 6C, respective curved lines making up the pattern G31 become concentric circles with the terminal marker $V_{UE}$ made as the center.

The display control unit 182 displays the pattern G31 that is created by the pattern display control unit 1822 on the operation screen shown in FIG. 5B, which is created by the marker display control unit 1821, in an overlapping manner. Due to this, the operator may easily discriminate a variation of the amount of attenuation, which corresponds to the position of the terminal marker $V_{UE}$, of a signal transmitted from the mobile communication terminal UE at each position.

In addition, the patterns G11, G21, G22, and G31 are not limited to the isoline, and for example, may be displayed (for example, gradation display) in such a manner that a calculated value (an amount of delay or an amount of attenuation) is correlated to a predetermined color, and each region on the coordinate system is classified according to the value.

In addition, the pattern G11, G21, G22, and G31 may be configured so as to be capable of being displayed while switching between each of these, or may be displayed in such a manner that a part or the entireties thereof overlap.

In addition, in the patterns G11, G21, G22, and G31, it is not necessary for the position on the coordinate system and the calculated value (that is, a value of the amount of delay or the amount of attenuation) to strictly correspond to each other in one-to-one manner. For example, the region on the coordinate system is schematically divided into a plurality of regions, and with respect to the respective regions, a value that corresponds to any one of positions included in the regions may be allocated to each region. In addition, the respective patterns that are presented as a curved line in FIGS. 6A to 6C may be drawn, for example, as a linear line obtained by approximating part or the entirety of the respective curved lines. In this case, operation may be carried out in such a manner that a value (a value of the amount of delay or the amount of attenuation) based on a designated position is used for test, or the operation may be carried out in such a manner that a value, which is correlated to a region in which the position is included, is used for the test.

In addition, in the above description, the amount of delay or the amount of attenuation is calculated for each sampling point, but instead of this, the respective patterns (for example, patterns G11, G21, G22, and G31) may be created by using a position of each marker as a variable. For example, in the case of the amount of delay, the amount of delay may be derived as a function representing each curved line, which makes up the pattern G11 (isoline), for each amount of delay by developing Expression 1 into an expression of x1 and y1 while changing the difference $D_{diff}$. In the case of the amount of attenuation, on the basis of a relationship between the distance from each marker and the amount of attenuation, a function representing a circle with the marker made as the center may be derived for each amount of attenuation. At this time, as described above, respective circles for respective amount of attenuation become concentric circles with a corresponding maker made as the center. In addition, in the present invention, a value representing a characteristic of an RF signal such as the amount of delay and the amount of attenuation is described as a characteristic value.

The setting information display control unit 1823 is configured to create an operation screen for designating setting information of the relay node RN. For example, discrimination information of the relay node RN, information that is necessary for creating the C-Plane, or the like is included in the setting information. Information such as a template for designating this setting information and option is created in advance and is stored in the setting information storage unit 185. The setting information display control unit 1823 creates an operation screen for designating the setting information on the basis of the information that is stored in the setting information storage unit 185. The display control unit 182 outputs the operation screen that is created by the setting information display control unit 1823 to the UI 19. Due to this, the operator may designate the setting information of the relay node RN on the basis of the operation screen. On the basis of this operation screen, the UI 19 outputs the setting information of the relay node RN, which is set by the operator, to the setting information output unit 186.

The setting information output unit 186 receives the setting information of the relay node RN, which is designated by the operator, via the UI 19. The setting information output unit 186 outputs this setting information to the control unit 17. Due to this, for example, the information that is necessary for creating the C-Plane is transmitted from the control unit 17 to the C-Plane transmission processing unit 124.

The UI 19 is a user interface for operating the relay node simulator 1 by a user. The UI 19 is provided with a display unit. The UI 19 receives an operation screen for designating a measurement condition or setting information of the relay node RN from the display control unit 182, and allows this operation screen to be displayed on the display unit. In addition, the UI 19 is provided with an operation unit. The UI 19 receives information representing positions of the relay node marker $V_{RN}$ and the terminal marker $V_{UE}$ that are designated by the operator via the operation unit and outputs this information to the position specifying unit 181. In addition, the UI 19 receives setting information, which is input by the operator, of the relay node RN via the operation unit and outputs this information to the setting information output unit 186.

Figure 7:
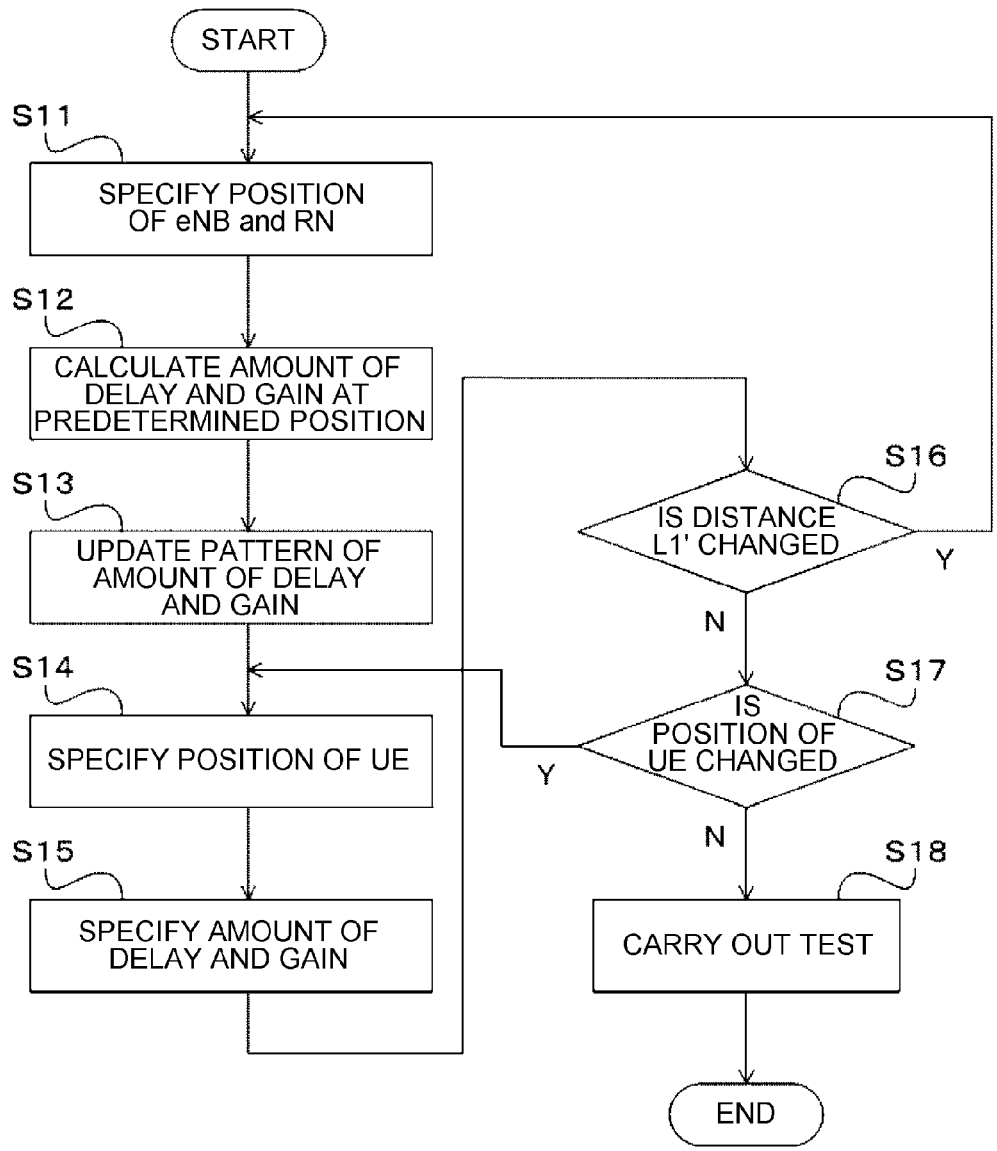
FIG. 7 is a flowchart illustrating a series of operations of the UI control unit.

Next, a series of operations of the UI control unit 18 will be described by giving attention to display of the operation screen and operation until the amount of delay D1, the gain Genb, and the level Grn are output to the control unit 17 on the basis of this operation screen while referring to FIG. 7. FIG. 7 shows a flowchart illustrating a series of operations of the UI control unit 18.

(Step S11)

When receiving an instruction of displaying the operation screen from the UI 19, first, the marker display control unit 1821 creates an operation screen for designating a position of the relay node marker $V_{RN}$ as shown in FIG. 5A. Specifically, the marker display control unit 1821 creates an operation screen that is configured in such a manner that the base station marker $V_{eNB}$ is fixed at a predetermined position on the coordinate system, and the relay node marker $V_{RN}$ is movable in one-dimension with the base station marker $V_{eNB}$ made as a reference. The display control unit 182 outputs this operation screen that is created by the marker display control unit 1821 to the UI 19. Due to this, the operator may designate the position of the relay node marker $V_{RN}$ while operating an operation screen as shown in FIG. 5A.

The position specifying unit 181 receives position information of the relay node marker $V_{RN}$, which is designated by the operator, from the UI 19. The position specifying unit 181 output the position information of the relay node marker $V_{RN}$ to the display control unit 182. In response to this, the display control unit 182 updates a display position of the relay node marker $V_{RN}$ on the operation screen and allows this operation screen to be displayed on the UI 19. In addition, the position specifying unit 181 outputs respective pieces of position information of the base station marker $V_{eNB}$ and the relay node marker $V_{RN}$ to the delay amount calculating unit 183 and the gain calculating unit 184, respectively.

(Step S12)

The delay amount calculating unit 183 receives respective pieces of position information of the base station marker $V_{eNB}$ and relay node marker $V_{RN}$ from the position specifying unit 181. The delay amount calculating unit 183 calculates the distance L1' between the base station marker $V_{eNB}$ and the relay node marker $V_{RN}$ on the basis of these pieces of position information. With respect to each sampling point on the coordinate system, the delay amount calculating unit 183 calculates the distance L0' between a position thereof and the base station marker $V_{eNB}$, and L2' between the position and the relay node marker $V_{RN}$, respectively. The delay amount calculating unit 183 calculates a difference $D_{diff}$ between the distance L0' and the distance L1'+L2' by applying the distances L1', L0', and L2' that are calculated to Expression 1.

The delay amount calculating unit 183 converts the $D_{diff}$ that is calculated for each sampling point into a distance on an actual environment on the basis of information that is determined in advance and that represents a contraction scale between a distance on the operation screen and a distance on an actual environment. The delay amount calculating unit 183 divides the calculated distance by a propagation velocity c of a signal to calculate the amount of delay D1 at each sampling point, and correlates this amount of delay D1 to the position information at the sampling point. The delay amount calculating unit 183 outputs the position information, to which the information representing the amount of delay D1 is correlated, of each sampling point to the pattern display control unit 1822.

In addition, the gain calculating unit 184 receives respective pieces of position information of the base station marker $V_{eNB}$ and the relay node marker $V_{RN}$ from the position specifying unit 181. With respect to each sampling point, the gain calculating unit 184 calculates the distance L0' between a position of the sampling point and the base station marker $V_{eNB}$ and the distance L2' between this position and the relay node marker $V_{RN}$ on the basis of these pieces of position information.

The gain calculating unit 184 converts the distances L0' and L2' that are calculated for each sampling point into distances L0 and L2 on an actual environment on the basis of information that is determined in advance and that represents a contraction scale between a distance on the operation screen and a distance on an actual environment. The gain calculating unit 184 calculates an amount of attenuation Genb' of the RF signal E0' at each sampling point on the basis of the distance L0 that is calculated. In addition, the gain calculating unit 184 calculates an amount of attenuation Grn' of the RF signal E1' at each sampling point on the basis of the distance L2 that is calculated. The gain calculating unit 184 correlates the amount of attenuation Genb' and the amount of attenuation Grn', which are calculated for each sampling point, to position information of the sampling point. The gain calculating unit 184 outputs the position information, which is correlated to the amount of attenuation Genb' and the amount of attenuation Grn', of each sampling point to the pattern display control unit 1822.

(Step S13)

When the position of the relay node marker $V_{RN}$ is specified on the basis of an instruction of the operator, the marker display control unit 1821 creates an operation screen, which is shown in FIG. 5B, for designating the position of the terminal marker $V_{UE}$. Specifically, the marker display control unit 1821 creates an operation screen that is configured in such a manner that the terminal marker $V_{UE}$ is movable in two-dimension with respect to the base station marker $V_{eNB}$ and the relay node marker $V_{RN}$. The display control unit 182 outputs this operation screen that is created by the marker display control unit 1821 to the UI 19.

After the positions of the base station marker $V_{eNB}$ and the relay node marker $V_{RN}$ are specified, the pattern display control unit 1822 receives position information, to which information representing the amount of delay D1 is correlated, of each sampling point from the delay amount calculating unit 183. The pattern display control unit 1822 correlates the received position information of each sampling point to a position on the coordinate system. Due to this, the amount of delay D1, which is correlated to the position information of the sampling point corresponding to the position on the coordinate system, is correlated to the position on the coordinate system. The pattern display control unit 1822 creates the pattern G11 displaying the amount of delay D1, which is correlated to each position on the coordinate system, in a discriminable manner. FIG. 6A shows an example of this pattern G11. Specifically, the pattern display control unit 1822 specifies sampling points at which values of the amount of delay D1 are substantially the same as each other, and creates a curved line connecting these points. The pattern display control unit 1822 carries out a process relating to the creation of the curved line for each value of the amount of delay D1 while changing this value in a predetermined range. Due to this, the pattern G11 (that, an isoline) as shown in FIG. 6A is created.

The display control unit 182 displays the pattern G11 that is created by the pattern display control unit 1822 on the operation screen shown in FIG. 5B, which is created by the marker display control unit 1821, in an overlapping manner.

After the positions of the base station marker $V_{eNB}$ and the relay node marker $V_{RN}$ are specified, the pattern display control unit 1822 receives position information, to which the amount of attenuation Genb' and the amount of attenuation Grn' are correlated, of each sampling point from the gain calculating unit 184. The pattern display control unit 1822 correlates the received position information of each sampling point to a position on the coordinate system. Due to this, the amount of attenuation Genb' and the amount of attenuation Grn', which are correlated to the position information of the sampling point corresponding to the position on the coordinate system, are correlated to the position on the coordinate system. The pattern display control unit 1822 creates patterns G21 and G22 that display the amount of attenuation Genb' and the amount of attenuation Grn', which are correlated to each position on the coordinate system, in a discriminable manner. FIG. 6B shows an example of these patterns G21 and G22. For example, in the case of creating the pattern G21, the pattern display control unit 1822 specifies sampling points at which values of the amount of attenuation Genb' are substantially the same as each other and creates a curve line connecting these points. The pattern display control unit 1822 carries out a process relating to the creation of the curved line for each value of the amount of attenuation Genb' while changing this value in a predetermined range. Due to this, the pattern G21 (that, an isoline) as shown in FIG. 6B is created. Similarly, in the case of pattern G22, the pattern display control unit 1822 creates each curved line making up the pattern G22 on the basis of the value of the amount of attenuation Grn'. In addition, as it is distant from corresponding devices (the base station eNB and the relay node RN), values of the amount of attenuation Genb' and the amount of attenuation Grn' increase. Therefore, as shown in FIG. 6B, respective curved lines making up each of the patterns G21 and G22 become concentric circles with a corresponding marker made as the center.

The display control unit 182 displays the patterns G21 and G22 that are created by the pattern display control unit 1822 on the operation screen shown in FIG. 5B, which is created by the marker display control unit 1821, in an overlapping manner.

(Step S14)

After specifying the position of the relay node marker $V_{RN}$, the position specifying unit 181 receives information, which represents the position of the terminal marker $V_{UE}$ that is designated by the operator, from the UI 19. For example, in the case of FIG. 5B, the position specifying unit 181 receives coordinates P2(x1, y1), which represents the position of the terminal marker $V_{UE}$, as position information from the UI 19. The position specifying unit 181 outputs the position information of the terminal marker $V_{UE}$ to the display control unit 182. In response to this, the display control unit 182 updates a display position of the terminal marker $V_{UE}$ on the operation screen and allows this operation screen to be displayed on the UI 19. In addition, the position specifying unit 181 outputs the position information of the terminal marker $V_{UE}$ to the delay amount calculating unit 183 and the gain calculating unit 184.

(Step S15)

The delay amount calculating unit 183 receives position information of the terminal marker $V_{UE}$ from the position specifying unit 181. The delay amount calculating unit 183 specifies a sampling point corresponding to the received position information and extracts the amount of delay D1 that is correlated to the sampling point.

In addition, after the positions of the base station marker $V_{eNB}$ and the relay node marker $V_{RN}$ are specified, the gain calculating unit 184 receives position information of the terminal marker $V_{UE}$ from the position specifying unit 181. With respect to each sampling point, the gain calculating unit 184 calculates the distance L3' between the position of the sampling point and the terminal marker $V_{UE}$. The gain calculating unit 184 converts the distance L3' that is calculated for each sampling point into a distance L3 on an actual environment on the basis of information that is determined in advance and that represents a contraction scale between a distance on the operation screen and a distance on an actual environment. The gain calculating unit 184 calculates an amount of attenuation Gue' of a signal transmitted from the mobile communication terminal UE at each sampling point on the basis of the distance L3. The gain calculating unit 184 correlates the amount of attenuation Gue', which is calculated for each sampling point, to position information of the sampling point. The gain calculating unit 184 outputs the position information, to which the amount of attenuation Gue' is correlated, of each sampling point to the pattern display control unit 1822.

After the position of the terminal marker $V_{UE}$ is specified, the pattern display control unit 1822 receives position information, to which the amount of attenuation Gue' is correlated, of each sampling point from the gain calculating unit 184. The pattern display control unit 1822 correlates the received position information of each sampling point to a position on the coordinate system. Due to this, the amount of attenuation Gue', which is correlated to the position information of the sampling point corresponding to the position on the coordinate system, is correlated to the position on the coordinate system. The pattern display control unit 1822 creates a pattern G31 that displays the amount of attenuation Gue' that is correlated to each position on the coordinate system in a discriminable manner. FIG. 6C shows an example of this pattern G31. Specifically, the pattern display control unit 1822 specifies sampling points at which values of the amount of attenuation Gue' are substantially the same as each other and creates a curve line connecting the sampling points. The pattern display control unit 1822 carries out a process relating to the creation of the curved line for each value of the amount of attenuation Gue' while changing this value in a predetermined range. Due to this, the pattern G31 (that, an isoline) as shown in FIG. 6C is created. In addition, as it is distant from the mobile communication terminal UE, the value of the amount of attenuation Gue' increases. Therefore, as shown in FIG. 6C, respective curved lines making up the pattern G31 become concentric circles with the terminal marker $V_{UE}$ made as the center.

The display control unit 182 displays the pattern G31 that is created by the pattern display control unit 1822 on the operation screen shown in FIG. 5B, which is created by the marker display control unit 1821, in an overlapping manner.

In addition, the gain calculating unit 184 specifies the sampling point corresponding to the received position information of the terminal marker $V_{UE}$, and extracts the amount of attenuation Genb' and the amount of attenuation Grn' that are correlated to the sampling point.

(Step S16)

In addition, in a case where a position of the relay node marker $V_{RN}$ is changed by the operator via the UI 19 (Y in step S16), a series of processes after step S11 is carried out again.

(Step S17)

In addition, in a case where a position of the terminal marker $V_{UE}$ is changed by the operator via the UI (Y in step S17), a series of processes after step S14 is carried out again.

(Step S18)

In a case where the positions of the relay node marker $V_{RN}$ and the terminal marker $V_{UE}$ are specified (N in step S16, and N in step S17), the delay amount calculating unit 183 outputs the amount of delay D1 that is extracted to the control unit 17. Due to this, the amount of delay D1 is set in the delay processing unit 132 via the control 17. In addition, the delay amount calculating unit 183 may be operated in such a manner that when receiving position information of the terminal marker $V_{UE}$, the delay amount calculating unit 183 calculates the amount of delay D1 that corresponds to the position on the basis of Expression 1 and outputs this amount of delay D1 to the control unit 17. In addition, the gain calculating unit 184 outputs the amount of attenuation Genb' and the amount of attenuation Grn' that are extracted to the control unit 17 as gain Genb and a level Grn. Due to this, the gain Genb and the level Grn are set in the gain adjusting units 131 and 14 via the control unit 17. Hereinafter, test is carried out on the basis of these setting values.

Hereinbefore, the relay node simulator 1 relating to this embodiment calculates the amount of delay D1, the gain Genb, and the level Grn in the case of changing the position of the terminal marker $V_{UE}$ on the basis of the positions of the base station marker $V_{eNB}$ and the relay node marker $V_{RN}$. The relay node simulator 1 allows the patterns G11, G21, and G22 (or G31) in which these values are presented in a discriminable manner to be displayed on the operation screen. Due to this, in a case of changing the position of the terminal marker $V_{UE}$, the operator may easily confirm a variation of the amount of delay D1, the gain Genb, and the level Grn at each position.

In addition, the relay node simulator 1 receives the position information of the terminal marker $V_{UE}$ that is designated on the basis of the patterns G11, G21, and G22 (or G31) and determines the amount of delay D1, the gain Genb, and the level Grn to be used for test. Due to this, by only determining a positional relationship between base station marker $V_{eNE}$, relay node marker $V_{RN}$, and terminal marker $V_{UE}$, the operator may create a test signal corresponding to the positional relationship by the relay node simulator 1.

In addition, in this embodiment, a description was made with respect to a configuration in which a signal transmitted from the relay node RN and a signal transmitted from the base station eNB are multiplexed in a time-division manner as an example, but the present invention is applicable to a configuration in which the time-division multiplexing as described above is not carried out, signals are continuously output from the base station, and allocation of a resource element is controlled with respect to signals transmitted from the base station and signals transmitted from the relay node to prevent interference of these signal.

This embodiment is configured in such a manner that the RF signal E0' transmitted from the eNB 500 is received by the reception unit 11 and is converted to a baseband signal, but the reception unit 11 may be omitted and the baseband signal E0 before being converted to the RF signal E0' may be directly received. In this case, for example, when instead of the eNB 500, a pseudo-base station device that is capable of outputting the baseband signal E0 is connected to the relay node simulator of the present invention, the same test may be carried out with respect a terminal to be tested. Here, the baseband signal E0 before being converted to the RF signal E0' represents a baseband signal corresponding to the RF signal E0'.

DESCRIPTION OF REFERENCE NUMERALS AND SIGNS

1: Relay node simulator
10: Downlink processing unit
11: Reception unit
12: Relay processing unit
121: Demodulation Unit
122: U-Plane reproduction processing unit
123: U-Plane transmission processing unit
124: C-Plane transmission processing unit
125: Modulation unit 131: Gain adjusting unit
132: Delay processing unit
14: Gain adjusting unit
15: Adder
16: Transmission unit
17: Control unit
18: UI control unit
181: Position specifying unit
182: Display control unit
1821: Marker display control unit
1822: Pattern display control unit
1823: Setting information display control unit
183: Delay amount calculating unit
184: Gain calculating unit
185: Setting information storage unit
186: Setting information output unit
19: UI
20: Uplink processing unit
31: Directional coupler
32: Directional coupler
500: eNB
600: Terminal to be tested

The invention claimed is:

1. A relay node simulator that outputs a test signal obtained by simulating a signal in which a first RF signal transmitted from a base station and a second RF signal that is transmitted to a mobile communication terminal by a relay node that receives the first RF signal are multiplexed, the relay node simulator comprising:
a user interface unit that displays an operation screen and receives an operation input from an operator;
a marker display control unit that correlates a base station marker corresponding to the base station, a relay node marker corresponding to the relay node, and a terminal marker corresponding to the mobile communication terminal to a predetermined coordinate system and allows the markers to be displayed on the operation screen, and that allows at least one of the markers to be displayed on the operation screen in a movable manner in accordance with the operation input;
a position specifying unit that specifies respective positions of the base station marker, the relay node marker, and the terminal marker in the coordinate system; and
a pattern display control unit that allows a magnitude of a characteristic value relating to the first RF signal or the second RF signal to be displayed on the operation screen as a discriminable pattern (G11, G21, G22, or G31),
wherein, when a position of at least one of the respective markers is specified in the pattern, the test signal to which the characteristic value corresponding to the specified position is applied is output, and
wherein the test signal is the signal in which the first RF signal transmitted from the base station and the second RF signal that is transmitted to a mobile communication terminal by a relay node that receives the first RF signal are multiplexed.

2. The relay node simulator according to claim 1, further comprising:
a delay amount calculating unit that calculates an amount of delay of the second RF signal until the second RF signal reaches the mobile communication terminal using the position of the terminal marker with respect to the position of the base station marker and the position of the relay node marker that are specified as variables,
wherein on the basis of the amount of delay calculated as the characteristic value, the pattern display control unit allows a magnitude of the amount of delay corresponding to the position of the terminal marker to be displayed on the operation screen as the discriminable pattern, and
when the position of the terminal marker is designated on the pattern, the test signal, which is obtained by simulating a signal in which the first RF signal and the second RF signal to which the amount of delay corresponding to the designation position is applied are multiplexed, is output.

3. The relay node simulator according to claim 2, wherein the delay amount calculating unit calculates the amount of delay on the basis of a distance between the base station marker and the relay node marker in the coordinate system.

4. The relay node simulator according to claim 2, wherein the pattern display control unit allows a curved line, which is obtained by connecting the positions in which the amounts of delay that are calculated are substantially the same, to be displayed on the operation screen as the pattern for each amount of delay.

5. The relay node simulator according to claim 1, further comprising:
a gain calculating unit that calculates an amount of attenuation corresponding to a distance from a corresponding marker in the coordinate system with respect to signals that are transmitted from respective devices,
wherein on the basis of the amount of attenuation that is calculated as the characteristic value, the pattern display control unit allows magnitudes of the amount of attenuation of signals, which are transmitted from the respective devices, at each position of the coordinate system to be displayed on the operation screen as the discriminable patterns, and
when the respective positions of the base station marker, the relay node marker, and the terminal marker are specified in the pattern, the test signal, which is obtained by simulating a signal in which the first RF signal which is transmitted from the base station and to which the amount of attenuation corresponding to the specified position is applied and the second RF signal which is transmitted from the relay node and to which the amount of attenuation corresponding to the specified position is applied are multiplexed, is output.

6. The relay node simulator according to claim 1, further comprising:
a gain calculating unit that calculates an amount of attenuation corresponding to a distance from the terminal marker in the coordinate system with respect to signals that are received by the mobile communication terminal,
wherein on the basis of the amount of attenuation that is calculated as the characteristic value, the pattern display control unit allows a magnitude of the amount of attenuation at each position of the coordinate system to be displayed on the operation screen as the discriminable pattern, and
when the respective positions of the base station marker, the relay node marker, and the terminal marker are specified in the pattern, the test signal, which is obtained by simulating a signal in which the first RF signal which is transmitted from the base station and to which the amount of attenuation corresponding to the specified position is applied and the second RF signal which is transmitted from the relay node and to which the amount of attenuation corresponding to the specified position is applied are multiplexed, is output.

7. A test method that outputs a test signal obtained by simulating a signal in which a first RF signal transmitted from a base station and a second RF signal that is transmitted to a mobile communication terminal by a relay node that receives the first RF signal are multiplexed, the test method comprising:

a multiplexing step of multiplexing the first RF signal transmitted from the base station and the second RF signal transmitted to the mobile communication terminal by the relay node that receives the first RF signal;

a screen display step of correlating a base station marker corresponding to the base station, a relay node marker corresponding to the relay node, and a terminal marker corresponding to the mobile communication terminal to a predetermined coordinate system and allowing the markers to be displayed on an operation screen in a relatively movable manner;

a position specifying step of specifying respective positions of the base station marker, the relay node marker, and the terminal marker in the coordinate system;

a pattern display step of allowing a magnitude of a characteristic value relating to the first RF signal or the second RF signal to be displayed on the operation screen as a discriminable pattern; and an output step of outputting the test signal to which the characteristic value corresponding to the specified position is applied when a position of at least one of the respective markers is specified in the pattern.

8. The test method according to claim 7, further comprising:

a delay amount calculating step of calculating an amount of delay of the second RF signal until the second RF signal reaches the mobile communication terminal by using the position of the terminal marker with respect to the position of the base station marker and the position of the relay node marker that are specified as a variable, wherein in the pattern display step, on the basis of the amount of delay calculated as the characteristic value, a magnitude of the amount of delay corresponding to the position of the terminal marker is allowed to be displayed on the operation screen as the discriminable pattern, and wherein in the output step, when the position of the terminal marker is designated on the pattern, the test signal, which is obtained by simulating a signal in which the first RF signal and the second RF signal to which the amount of delay corresponding to the designation position is applied are multiplexed, is output.

9. The test method according to claim 8, wherein in the delay amount calculating step, the amount of delay is calculated on the basis of a distance between the base station marker and the relay node marker in the coordinate system.

10. The test method according to claim 8, wherein in the pattern display step, a curved line, which is obtained by connecting the positions in which the amounts of delay that are calculated are substantially the same, is allowed to be displayed on the operation screen as the pattern for each amount of delay.

11. The test method according to claim 7, further comprising:

a gain calculating step of calculating an amount of attenuation corresponding to a distance from a corresponding marker in the coordinate system with respect to signals that are transmitted from respective devices, wherein in the pattern display step, on the basis of the amount of attenuation that is calculated as the characteristic value, magnitudes of the amount of attenuation of signals, which are transmitted from the respective devices, at each position of the coordinate system is allowed to be displayed on the operation screen as the discriminable patterns, and in the output step, when the respective positions of the base station marker, the relay node marker, and the terminal marker are specified in the pattern, the test signal, which is obtained by simulating a signal in which the first RF signal which is transmitted from the base station and to which the amount of attenuation corresponding to the specified position is applied and the second RF signal which is transmitted from the relay node and to which the amount of attenuation corresponding to the specified position is applied are multiplexed, is output.

12. The test method according to claim 7, further comprising:

a gain calculating step of calculating an amount of attenuation corresponding to a distance from the terminal marker in the coordinate system with respect to signals that are received by the mobile communication terminal, wherein in the pattern display step, on the basis of the amount of attenuation that is calculated as the characteristic value, a magnitude of the amount of attenuation at each position of the coordinate system is allowed to be displayed on the operation screen as the discriminable pattern, and in the output step, when the respective positions of the base station marker, the relay node marker, and the terminal marker are specified in the pattern, the test signal, which is obtained by simulating a signal in which the first RF signal which is transmitted from the base station and to which the amount of attenuation corresponding to the specified position is applied and the second RF signal which is transmitted from the relay node and to which the amount of attenuation corresponding to the specified position is applied are multiplexed, is output.

\* \* \* \* \*